United States Patent
Lung et al.

(10) Patent No.: US 8,324,605 B2
(45) Date of Patent: Dec. 4, 2012

(54) DIELECTRIC MESH ISOLATED PHASE CHANGE STRUCTURE FOR PHASE CHANGE MEMORY

(75) Inventors: Hsiang-Lan Lung, Elmsford, NY (US); Chieh-Fang Chen, Panchiao (TW); Yen-Hao Shih, Banqiao (TW); Ming-Hsiu Lee, Hsinchu (TW); Matthew J. Breitwisch, Yorktown Heights, NY (US); Chung Hon Lam, Peekskill, NY (US); Frieder H. Baumann, Redbank, NJ (US); Philip Flaitz, Newburgh, NY (US); Simone Raoux, Santa Clara, CA (US)

(73) Assignees: Macronix International Co., Ltd., Hsinchu (TW); International Business Machines Corporation, Armonk, NY (US)

(*) Notice: Subject to any disclaimer, the term of this patent is extended or adjusted under 35 U.S.C. 154(b) by 318 days.

(21) Appl. No.: 12/286,874

(22) Filed: Oct. 2, 2008

(65) Prior Publication Data

US 2010/0084624 A1    Apr. 8, 2010

(51) Int. Cl.
*H01L 47/00* (2006.01)
*H01L 21/06* (2006.01)

(52) U.S. Cl. ............. 257/2; 257/E47.001; 257/E21.068; 438/102; 438/95; 365/148

(58) Field of Classification Search ....... 257/2, E47.001, 257/E21.068; 365/148
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,177,475 A | 12/1979 | Holmberg | |
| 4,452,592 A | 6/1984 | Tsai | |
| 4,599,705 A | 7/1986 | Holmberg et al. | |
| 4,719,594 A | 1/1988 | Young et al. | |

(Continued)

FOREIGN PATENT DOCUMENTS

WO    WO-0079539    12/2000

(Continued)

OTHER PUBLICATIONS

"Magnetic Bit Boost," www.sciencenews.org, Dec. 18 & 25, 2004, p. 389, vol. 166.

(Continued)

*Primary Examiner* — Ha Tran T Nguyen
*Assistant Examiner* — Jordan Klein
(74) *Attorney, Agent, or Firm* — Haynes Beffel & Wolfeld LLP

(57) ABSTRACT

A method for manufacturing a memory device, and a resulting device, is described using silicon oxide doped chalcogenide material. A first electrode having a contact surface; a body of phase change memory material in a polycrystalline state including a portion in contact with the contact surface of the first electrode, and a second electrode in contact with the body of phase change material are formed. The process includes melting and cooling the phase change memory material one or more times within an active region in the body of phase change material without disturbing the polycrystalline state outside the active region. A mesh of silicon oxide in the active region with at least one domain of chalcogenide material results. Also, the grain size of the phase change material in the polycrystalline state outside the active region is small, resulting in a more uniform structure.

21 Claims, 21 Drawing Sheets
(5 of 21 Drawing Sheet(s) Filed in Color)

U.S. PATENT DOCUMENTS

| | | | |
|---|---|---|---|
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,825,046 A * | 10/1998 | Czubatyj et al. | 257/2 |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A * | 7/2000 | Ovshinsky et al. | 257/2 |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,337,266 B1 | 1/2002 | Zahorik | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,106 B1 | 11/2002 | Kozicki | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung et al. | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,805,563 B2 | 10/2004 | Ohashi et al. | |
| 6,815,704 B1 | 11/2004 | Chen | |
| 6,838,692 B1 | 1/2005 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,881,603 B2 | 4/2005 | Lai | |
| 6,885,021 B2 | 4/2005 | Apodaca et al. | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen et al. | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,099,180 B1 | 8/2006 | Dodge et al. | |
| 7,115,927 B2 | 10/2006 | Hideki et al. | |
| 7,122,281 B2 | 10/2006 | Pierrat | |
| 7,122,824 B2 | 10/2006 | Khouri et al. | |

| Patent/Pub No. | Date | Name |
|---|---|---|
| 7,126,149 B2 | 10/2006 | Iwasaki et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,355,238 B2 * | 4/2008 | Takata et al. ............... 257/314 |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,453,081 B2 * | 11/2008 | Happ et al. .................. 257/3 |
| 7,473,576 B2 | 1/2009 | Lung |
| 7,479,649 B2 | 1/2009 | Lung |
| 7,501,648 B2 | 3/2009 | Chen et al. |
| 7,679,163 B2 * | 3/2010 | Chen et al. .................. 257/537 |
| 7,745,807 B2 * | 6/2010 | Chen et al. .................. 257/2 |
| 7,759,770 B2 * | 7/2010 | Happ et al. .................. 257/536 |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0062087 A1 | 3/2005 | Chen et al. |
| 2005/0093022 A1 | 5/2005 | Lung |
| 2005/0127349 A1 | 6/2005 | Horak et al. |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0105556 A1 | 5/2006 | Matsui et al. |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118853 A1 * | 6/2006 | Takata et al. .................. 257/314 |
| 2006/0118913 A1 | 6/2006 | Yi et al. |
| 2006/0121391 A1 | 6/2006 | Khang et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0175599 A1 | 8/2006 | Happ |
| 2006/0192193 A1 | 8/2006 | Lee et al. |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0029606 A1 * | 2/2007 | Noh et al. .................. 257/318 |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0096248 A1 | 5/2007 | Philipp et al. |
| 2007/0097739 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0267620 A1 * | 11/2007 | Happ .................. 257/4 |
| 2007/0274121 A1 | 11/2007 | Lung et al. |
| 2007/0285960 A1 | 12/2007 | Lung et al. |

| | | | |
|---|---|---|---|
| 2007/0298535 | A1 | 12/2007 | Lung |
| 2008/0006811 | A1 | 1/2008 | Philipp et al. |
| 2008/0012000 | A1 | 1/2008 | Harshfield |
| 2008/0014676 | A1 | 1/2008 | Lung et al. |
| 2008/0017842 | A1* | 1/2008 | Happ et al. ............... 257/4 |
| 2008/0025089 | A1 | 1/2008 | Scheuerlein et al. |
| 2008/0035907 | A1* | 2/2008 | Czubatyj et al. ........... 257/4 |
| 2008/0043520 | A1 | 2/2008 | Chen |
| 2008/0094871 | A1 | 4/2008 | Parkinson |
| 2008/0101110 | A1 | 5/2008 | Happ et al. |
| 2008/0137400 | A1 | 6/2008 | Chen et al. |
| 2008/0164453 | A1 | 7/2008 | Breitwisch et al. |
| 2008/0165569 | A1 | 7/2008 | Chen et al. |
| 2008/0165570 | A1 | 7/2008 | Happ et al. |
| 2008/0165572 | A1 | 7/2008 | Lung |
| 2008/0166875 | A1 | 7/2008 | Lung |
| 2008/0179582 | A1 | 7/2008 | Burr et al. |
| 2008/0180990 | A1 | 7/2008 | Lung |
| 2008/0186755 | A1 | 8/2008 | Lung et al. |
| 2008/0191187 | A1 | 8/2008 | Lung et al. |
| 2008/0192534 | A1 | 8/2008 | Lung |
| 2008/0197334 | A1 | 8/2008 | Lung |
| 2008/0224119 | A1 | 9/2008 | Burr et al. |
| 2008/0225489 | A1 | 9/2008 | Cai et al. |
| 2008/0265234 | A1 | 10/2008 | Breitwisch et al. |
| 2009/0001341 | A1 | 1/2009 | Breitwisch et al. |
| 2009/0014704 | A1* | 1/2009 | Chen et al. ............... 257/3 |
| 2009/0023242 | A1 | 1/2009 | Lung |
| 2009/0027950 | A1 | 1/2009 | Lam et al. |
| 2009/0042335 | A1 | 2/2009 | Lung |
| 2009/0057641 | A1 | 3/2009 | Lung |
| 2009/0078924 | A1* | 3/2009 | Liang et al. ............. 257/3 |
| 2010/0044665 | A1* | 2/2010 | Jedema ................... 257/2 |

FOREIGN PATENT DOCUMENTS

| | | |
|---|---|---|
| WO | WO-0145108 | 6/2001 |
| WO | WO-0225733 | 3/2002 |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published in 1997, pp. 1-6.
Bedeschi, F. et al., "4-MB MOSFET-Selected Phase-Change Memory Experimental Chip," IEEE, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.
Czubatyj, Wally, et al., "Current Reduction in Ovonic Memory Devices," E*PCOS06 2006, 10 pages.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," 2003 Symposium on VLSI Technology Digest of Technical Papers, pp. 175-176.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., "OUM-A 180 nm Nonvolatile Memory Cell Element Technology for Stand Alone and Embedded Applications," IEEE IEDM 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Lee, Tae-Yon, et al., "Separate domain formation in Ge2Sb2Te5—Siox mixed layer," Appl. Phys. Lett. 89, 163503, Oct. 16, 2006, 3 pages.
Mott, Nevill, "Electrons in Glass," Nobel Lecture, Dec. 8, 1977, Physics, 1977, pp. 403-413.
Noh, Jin-Seo, et al., "Modification of Ge2Sb2Te5 by the Addition of SiOx for Improved Operation of Phase Change Random Access Memory," Mater. Res. Soc. Symp. Proc. vol. 888-V05-09.1, 2006, 6 pages.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Ryu, Seung Wook, et al., "SiO2 Incorporation Effects in Ge2Sb2Te5 Films Prepared by Magnetron Sputtering for Phase Change Random Access Memory Devices," Electrochemical and Solid-State Letters, 9 (8) G259-G261, May 23, 2006.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P. PDF#search='nonvolatile%20 high%20density%20high%20 performance% 20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Y1, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates, " Mat. Res. Soc. Symp. Proc., vol. 106, 1998, pp. 21-26.

Lin, Y.Y., et al., "Nano-crystalline phase change memory with composite Si-Sb-Te film for better data retention and lower operation current," 22nd IEEE Non-Volatile Semiconductor Memory Workshop, Aug. 26-30, 2007, 61-62.

Morikawa, T., et al., "Doped In-Ge-Te Phase Change Memory Featuring Stable Operation and Good Data Retention," IEEE IEDM Dec. 10-12, 2007, 307-10.

Qiao, Baowei, et al., "Si-Sb-Te films for phase-change random access memory," Semicond. Sci. Technol. 21 (2006) 1073-1076.

* cited by examiner

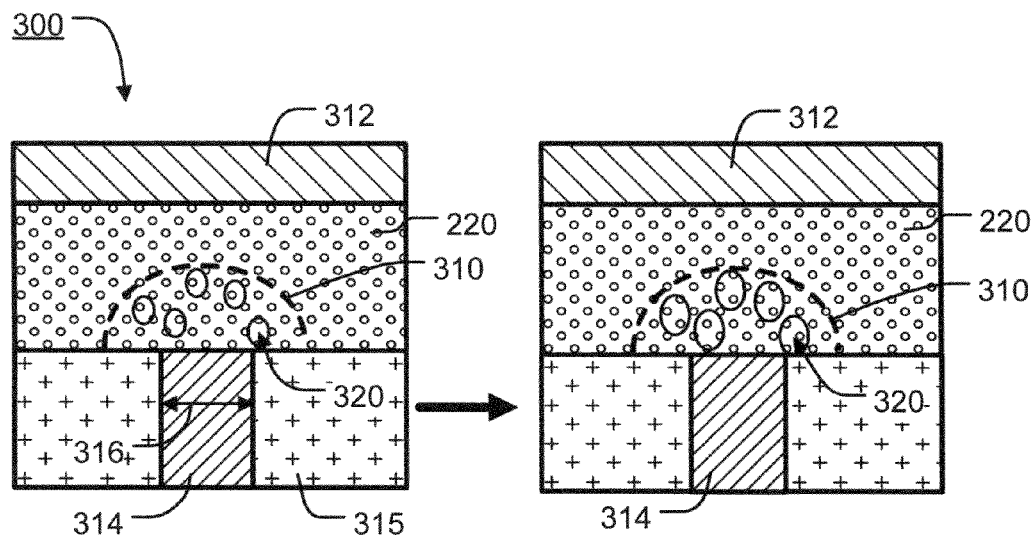
FIG. 3A
(Prior Art)
FIG. 3B
(Prior Art)
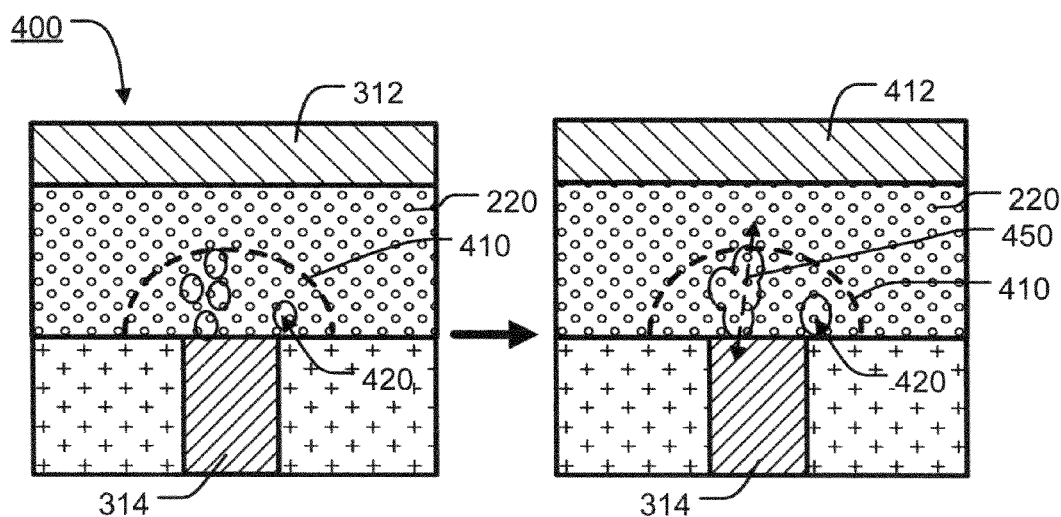
FIG. 4A
(Prior Art)
FIG. 4B
(Prior Art)

DIELECTRIC MESH ISOLATED PHASE CHANGE STRUCTURE FOR PHASE CHANGE MEMORY

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

1. Field of the Invention

The present invention relates to memory devices based on chalcogenide materials, and methods for manufacturing such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state.

The magnitude of the current needed for reset can be reduced by reducing the size of the phase change material element in the cell and/or the contact area between electrodes and the phase change material, such that higher current densities are achieved with small absolute current values through the phase change material element.

However, attempts to reduce the size of the phase change material element and/or the electrodes can result in electrical and mechanical reliability issues of the cell because of failures associated with the small contact surface therebetween. For example, because GST has two stable crystalline states that have different densities, modulation between the two crystalline states and the amorphous state can cause stresses at the interface and within the GST material.

The magnitude of the reset current needed to induce a phase change can be affected by doping the phase change material. Chalcogenides and other phase change materials can be doped with impurities to modify conductivity, transition temperature, melting temperature, and other properties of memory elements using the doped chalcogenides. Representative impurities used for doping chalcogenides include nitrogen, silicon, oxygen, silicon oxide, silicon nitride, copper, silver, gold, aluminum, aluminum oxide, tantalum, tantalum oxide, tantalum nitride, titanium and titanium oxide. See, e.g., U.S. Pat. No. 6,800,504 (metal doping), and U.S. Patent Application Publication No. U.S. 2005/0029502 (nitrogen doping).

U.S. Pat. No. 6,087,674, and its parent U.S. Pat. No. 5,825,046 by Ovshinsky et al., describe forming composite memory material in which phase change material is mixed with relatively high concentrations of dielectric material in order to manage the resistance of the composite memory material. The nature of the composite memory material described in these patents is not clear, because it describes composites as layered structures as well as mixed structures. The dielectric materials described in these patents cover a very broad range.

A number of researchers have investigated the use of silicon oxide doping of chalcogenide material for the purposes of reducing the reset current needed for operation of the memory devices. See, Ryu, et al., "$SiO_2$ Incorporation Effects in $Ge_2Sb_2Te_5$ Films Prepared by Magnetron Sputtering for Phase Change Random Access Memory Devices", Electrochemical and Solid-State Letters, 9 (8) G259-G261, (2006); Lee et al., "Separate domain formation in $Ge_2Sb_2Te_5$—$SiO_x$ mixed layer", Applied Physics Letters 89, 163503 (2006); Czubatyj et al., "Current Reduction in Ovonic Memory Devices", E*PCOS06 (2006); and Noh et al., "Modification of $Ge_2Sb_2Te_5$ by the Addition of $SiO_x$ for Improved Operation of Phase Change Random Access Memory", Mater. Res. Soc. Symp. Proc. Vol. 888 (2006). These references suggest that relatively low concentrations of silicon oxide doping in $Ge_2Sb_2Te_5$ result in substantial increases in resistance and corresponding reductions in reset current. The Czubatyj et al. article suggests that the improvement in resistance in a silicon oxide doped GST alloy saturates at about 10 vol % (6.7 at %), and reports that doping concentrations up to 30 vol % silicon oxide had been tested, without providing details. The Lee et al. publication describes a phenomenon at relatively high doping concentrations around 8.4 at %, by which the silicon oxide appears to separate from the GST after high-temperature annealing to form domains of GST surrounded by boundaries that are primarily silicon oxide.

Research has progressed to provide memory devices that operate with low reset current by adjusting a doping concentration in phase change material, and by providing structures with very small dimensions. One problem with very small dimension phase change devices involves endurance. Specifically, memory cells made using phase change materials can fail as the composition of the phase change material slowly changes with time because of the instability of the amorphous versus crystalline state. For example, a memory cell in which the active region has been reset to a generally amorphous state may over time develop a distribution of crystalline regions in the active region. If these crystalline regions connect to form a low resistance path through the active region, when the memory cell is read a lower resistance state will be detected and result in a data error. See, Gleixner, "Phase Change Memory Reliability", tutorial. 22nd NVSMW, 2007.

It is therefore desirable to provide memory cells having a small reset current and addressing the issues of data retention discussed above, as well as addressing the reliability issues of small contact surfaces between electrodes and phase change material discussed above.

SUMMARY OF THE INVENTION

A method for manufacturing a memory device is described using silicon oxide doped chalcogenide material which results in an improved memory cell. The method comprises forming a first electrode having a contact surface, a body of phase change memory material in a polycrystalline state including a portion in contact with the contact surface of the first electrode, and a second electrode in contact with the body of phase change material. The phase change memory material comprises a chalcogenide material doped with a dielectric material. The process includes melting and solidifying the phase change memory material one or more times within an active region in the body of phase change material without disturbing the polycrystalline state outside the active region. This cycling causes formation of a mesh of the dielectric material in the active region with at least one domain of chalcogenide material, without formation of the mesh outside the active region. The method has been demonstrated for silicon oxide doped for $Ge_xSb_yTe_z$, where x=2, y=2 and z=5, doped with 10 to 20 atomic % silicon oxide, and the resulting device demonstrates substantial improvement. However, the process can be extended to other chalcogenide materials and dielectric doping materials which are characterized by mesh formation as a result of melting and cooling cycles, reduced grain size in the polycrystalline state, and suppression of the formation of at least one of a plurality of crystalline phases in the polycrystalline state.

For a chalcogenide material used which is characterized by a plurality of solid crystalline phases, such as $Ge_xSb_yTe_z$, where x=2, y=2 and z=5, which has an FCC solid crystalline phase and an HCP solid crystalline phase, the chalcogenide material is doped with a concentration of dielectric material sufficient to prevent formation of at least one of the solid crystalline phases, such as the HCP solid crystalline phase, in the body of material outside the active region. Thus, the chalcogenide material used in the phase change memory material, when not doped with the dielectric is characterized by a first solid crystalline phase (e.g. HCP) having first volume and by a second solid crystalline phase (e.g. FCC) having second volume, the phase change memory material having a volume in the amorphous phase which is closer to the second volume than the first volume, and wherein the chalcogenide material doped with a dielectric material has a concentration of the dielectric material sufficient to promote formation of the second solid crystalline phase. By suppressing formation of the HCP phase, and thus limiting the structure in the set state to only or substantially only the FCC phase, the amount of change in volume that occurs in the transition from the amorphous phase to the crystalline phase is reduced, improving reliability of the memory. Also, the set operation occurs more quickly, when it is limited to only or substantially only the FCC phase.

Also, the grain size of the phase change material in the polycrystalline state outside the active region is small, resulting in a more uniform structure.

A manufacturing process described herein includes forming circuitry on the memory device to apply set and reset pulses to the memory cell for writing data, and performing said melting and cooling cycling in the active region of the memory cell by applying a sequence of reset pulses, or in the alternative, a sequence of set and reset pulses, to the memory cell.

A phase change memory device is provided that comprises a first electrode and a second electrode, and a body of phase change memory material in contact with the first and second electrodes, the phase change memory material comprising a silicon oxide (or other dielectric material) doped chalcogenide material. The body of phase change material has an active region between the first and second electrodes, the active region comprising a mesh of dielectric material with at least one domain of chalcogenide material, and has a region outside of the active region without the mesh and in which the phase change memory material has a polycrystalline state with a small grain size.

Other features, combinations of features, aspects and advantages of the technology described herein can be seen in the drawings, the detailed description and the claims which follow.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 3A-3B illustrate prior art mushroom style memory cells with active regions generally in the amorphous phase having pockets of crystallization.

FIGS. 4A-4B illustrate prior art mushroom style memory cells with active regions generally in the amorphous phase having pockets of crystallization that grow together causing a failure mode.

FIGS. 16B and 16C are images of the electron energy loss spectroscopy (EELS) of Si and O respectively.

DETAILED DESCRIPTION

Figure 1:
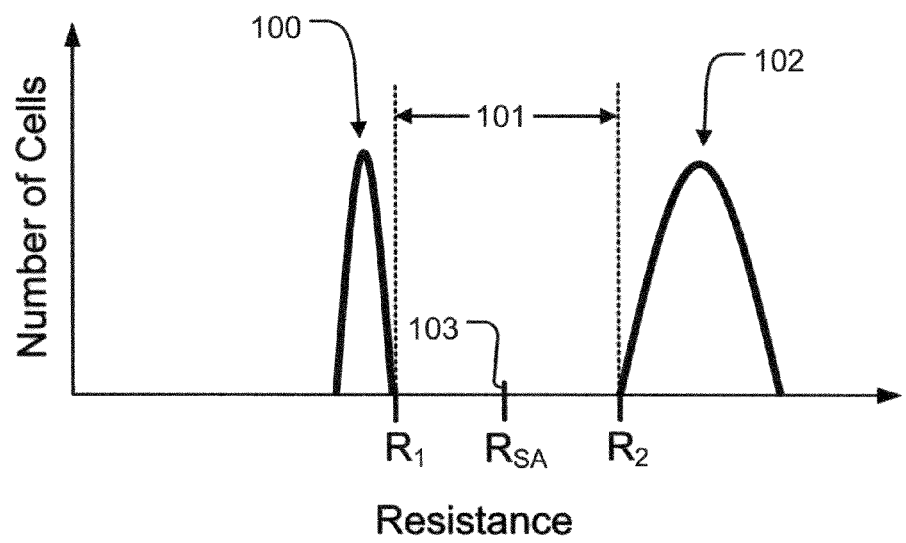
FIG. 1 is a graph showing resistance distributions for memory states in phase change memory cells.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

In phase change memory, data is stored by causing transitions in an active region of the phase change material between amorphous and crystalline phases. FIG. 1 is a graph of memory cells having one of two states (storing a single bit of data), a low resistance set (programmed) state 100 and a high resistance reset (erased) state 102 each having non-overlapping resistance ranges.

The difference between the highest resistance $R_1$ of the low resistance set state 100 and the lowest resistance $R_2$ of the high resistance reset state 102 defines a read margin 101 used to distinguish cells in the set state 100 from those in the reset state 102. The data stored in a memory cell can be determined by determining whether the memory cell has a resistance corresponding to the low resistance state 100 or to the high resistance state 102, for example by measuring whether the resistance of the memory cell is above or below a threshold resistance value RSA 103 within the read margin 101.

In order to reliably distinguish between the reset state 102 and the set state 100, it is important to maintain a relatively large read margin 101. However, it has been observed that some phase change memory cells in the reset state 102 can experience an erratic "tailing bit" effect in which the resistance of the memory cell decreases over time to below the threshold resistance value RSA 103, resulting in data retention problems and bit errors for those memory cells.

Figure 2A:
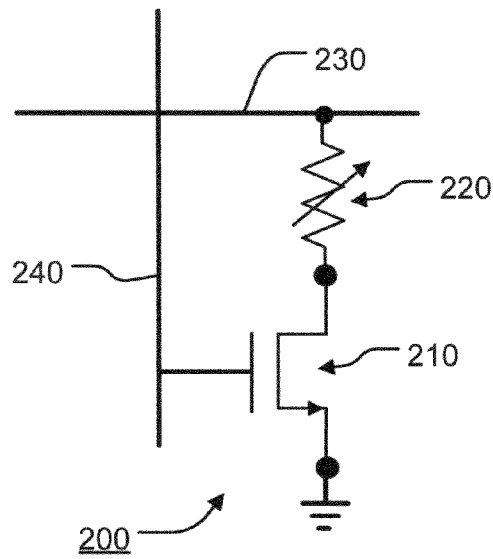
FIGS. 2A-2C are schematic illustrations of phase change memory devices including various access devices.
Figure 2B:
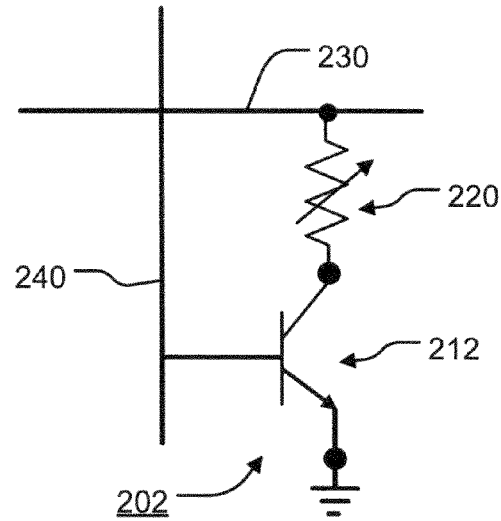
Figure 2C:
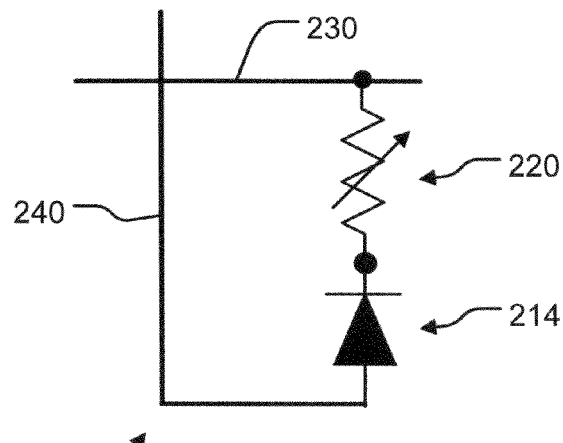

FIGS. 2A-2C illustrate schematic diagrams of three prior art phase change memory cells each having a phase change material memory element 220 (represented in the Figures by a variable resistor) and coupled to a select device such as a transistor or diode.

FIG. 2A illustrates a schematic diagram of a prior art memory cell 200 including a field effect transistor (FET) 210 as the select device. A word line 240 extending in a first direction is coupled to the gate of the FET 210 and a memory element 220 couples the drain of the FET 210 to a bit line 230 extending in a second direction.

FIG. 2B illustrates a schematic diagram of memory cell 202 similar to that of FIG. 2A except that the access device is implemented as a bipolar junction transistor (BJT) 212, while FIG. 2C illustrates a schematic diagram of a memory cell 204 similar to that of FIG. 2A except the access device is implemented as a diode 214.

Reading or writing can be achieved by applying suitable voltages to the word line 240 and bit line 230 to induce a current through the memory element 220. The level and duration of the voltages applied is dependent upon the operation performed, e.g. a reading operation or a writing operation.

In a reset (or erase) operation of a memory cell having memory element 220, a reset pulse is applied to the word line 240 and bit line 230 of suitable amplitude and duration to induce a current sufficient to cause a transition of an active region of the phase change material into an amorphous phase, thereby setting the phase change material to a resistance within a resistive value range associated with the reset state. The reset pulse is a relatively high energy pulse, sufficient to raise the temperature of at least the active region of the memory element 220 above the transition (crystallization) temperature of the phase change material and also above the melting temperature to place at least the active region in a liquid state. The reset pulse is then quickly terminated, resulting in a relatively quick quenching time as the active region quickly cools to below the transition temperature so that at least the active region stabilizes to an amorphous phase.

In a set (or program) operation of a memory cell having memory element 220, a program pulse is applied to the word line 240 and bit line 230 of suitable amplitude and duration to induce a current sufficient to raise the temperature of at least a portion of the active region above the transition temperature and cause a transition of at least a portion of the active region from the amorphous phase into a crystalline phase, this transition lowering the resistance of the memory element 220 and setting the memory cell to the desired state.

In a read (or sense) operation of a memory cell having memory element 220, a read pulse is applied to the word line 240 and bit line 230 of suitable amplitude and duration to induce a current to flow that does not result in the memory element 220 undergoing a change in resistive state. The current through the memory cell is dependent upon the resistance of the memory element 220 and thus the data value stored in the memory cell.

As was described above, in an array some of the memory cells in the high resistance reset state can experience a tailing bit effect in which those memory cells undergo a reduction in resistance over time, resulting in data retention issues and bit errors.

Illustrated in FIGS. 3 and 4 is a possible early-fail model for the trailing bit effect of memory cells in reset. Since the initial reset resistance of memory cells experiencing the tailing bit effect is high, a small or otherwise defective active region is not believed to be the likely cause. Instead, in the early fail model illustrated in FIGS. 3 and 4 a random distribution of crystallized regions within the generally amorphous active region will undergo growth over time. For memory cells experiencing the tailing bit effect the random arrangement of the crystallized regions results in the need for very little growth before a low resistance path through the active region is formed.

FIG. 3A illustrates a prior art "mushroom type" memory cell 300 having a first electrode 314 extending through dielectric 315, a memory element 220 comprising phase change material, and a second electrode 312 on the memory element 220. The first electrode 314 may, for example, be coupled to a terminal of an access device such as a diode or transistor, while the second electrode 312 may be coupled to a bit line. The first electrode 314 has a width 316 less than the width of the second electrode 312 and memory element 220. Because of this difference in width, in operation the current density is largest in the region adjacent the first electrode 314, resulting in the active region 310 having a "mushroom" shape as shown in the Figure.

It is desirable to minimize the width (which in some examples is a diameter) of the first electrode 314 so that higher current densities are achieved with small absolute current values through the memory element 220. However, attempts to reduce the width of the first electrode 314 can result in issues in the electrical and mechanical reliability of the interface between the first electrode 314 and the memory element 220 due to the small contact surface therebetween.

In reset, the memory element 220 has a generally amorphous active region 310 and a random distribution of crystalline regions 320 within the active region 310. As shown in FIG. 3B, over time the crystalline regions 320 within the active region 310 will experience growth but do not form a complete low resistance path through the active region 310.

Thus, although the memory cell illustrated in FIGS. 3A-3B may experience some reduction in resistance, it does not experience the tailing bit effect.

FIGS. 4A-4B illustrate a memory cell 400 having a random distribution of crystallized regions 420 within the active region 410 such that over time a low resistance path 450 is formed through the active region 410 as shown in FIG. 4B, resulting in the memory cell of FIGS. 4A-4B experiencing the tailing bit effect.

Figure 5A:
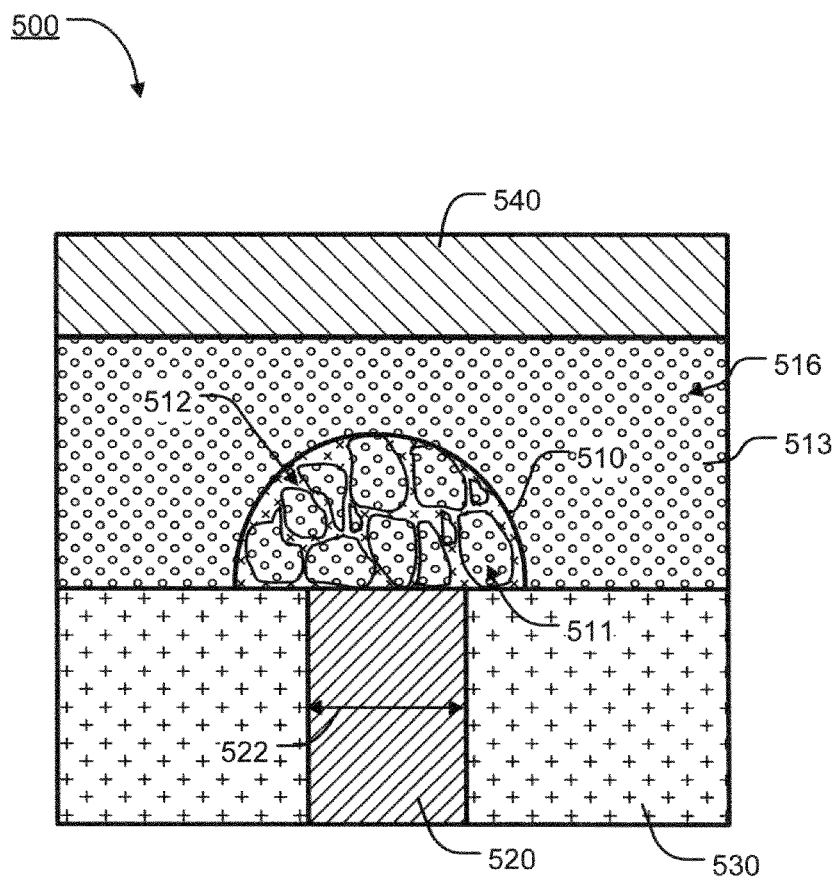
FIGS. 5A-5B illustrate a mushroom style memory cell as described herein having active regions comprising a dielectric mesh with the domains of phase change material, in the set and reset states respectively.
Figure 5B:
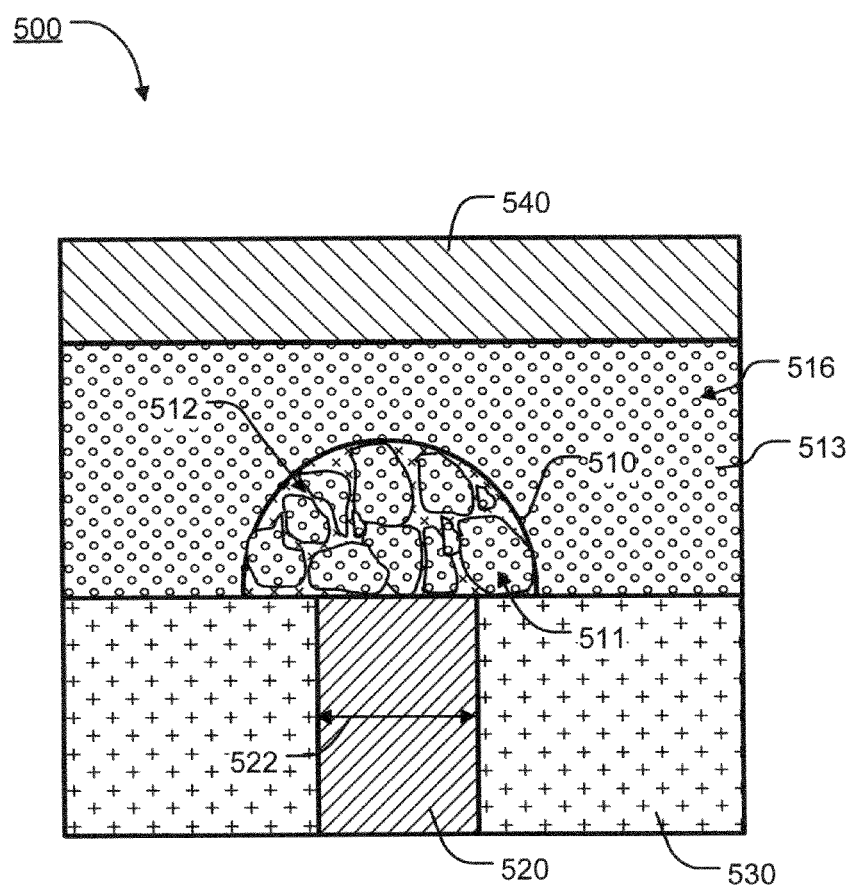

FIGS. 5A-5B illustrate cross-sectional views of a memory cell 500 having an active region 510 comprising phase change domains 511 within a dielectric-rich mesh 512, the memory cell 500 addressing the tailing bit and reliability issues described above and resulting in improved data retention, reduced bit errors and higher speed operation.

The memory cell 500 includes a first electrode 520 extending through dielectric 530 to contact a bottom surface of the memory element 516, and a second electrode 540 on the memory element 516 consisting of a body of dielectric doped phase change material. The first and second electrodes 520, 540 may comprise, for example, TiN or TaN. Alternatively, the first and second electrodes 520, 540 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof.

In the illustrated embodiment the dielectric 530 comprises SiN. Alternatively, other dielectric materials may be used.

The phase change material of memory element 516 in this example comprises $Ge_2Sb_2Te_5$ material doped with 10 to 20 atomic percent (at %) silicon oxide. Other chalcogenides and dielectric materials characterized by the mesh formation may be used as well. As can be seen in the Figures the width 522 (which in some embodiments is a diameter) of the first electrode 520 is less than that of the memory element 516 and top electrode 540, and thus current is concentrated in the portion of the memory element 516 adjacent the first electrode 520, resulting in the active region 510 as shown. The memory element 516 also includes an inactive region 513 outside the active region 510, the inactive region 513 in a polycrystalline state with small grain size, without dielectric mesh formation.

The active region 510 comprises phase change domains 511 within a dielectric-rich mesh 512. The dielectric-rich mesh 512 comprises a higher concentration of silicon oxide material than that of the inactive region 513, and the phase change domains 511 comprise a higher concentration of chalcogenide material than that of the inactive region 513.

FIG. 5A illustrates heuristically, the memory cell 500 in the high resistance reset state. In a reset operation of the memory cell 500, bias circuitry (See, for example, bias circuitry voltage and current sources 1736 of FIG. 17 with the accompanying controller 1734) coupled to the first and second electrodes 520, 540 induces a current to flow between the first and second electrodes 520, 540 via the memory element 516 sufficient to induce a high resistance generally amorphous phase in the phase change domains 511 of the active region 510 to establish a high resistance reset state in the memory cell 500. In the inactive region 513 outside the active region, the body of dielectric doped chalcogenide remains in the polycrystalline state, with a small grain size.

FIG. 5B illustrates heuristically, the memory cell 500 in the low resistance set state. In a set operation of the memory cell 500, bias circuitry coupled to the first and second electrodes 520, 540 induces a current to flow between the first and second electrodes 520, 540 via the memory element 516 sufficient to induce a low resistance generally crystalline phase in the phase change domains 511 of the active region 510 to establish a low resistance set state in the memory cell 500. The sizes of the domains in the low resistance state may be different than in the high resistance state, as suggested by FIGS. 5A and 5B. However, this has not been clearly demonstrated by experiment.

Figure 6:
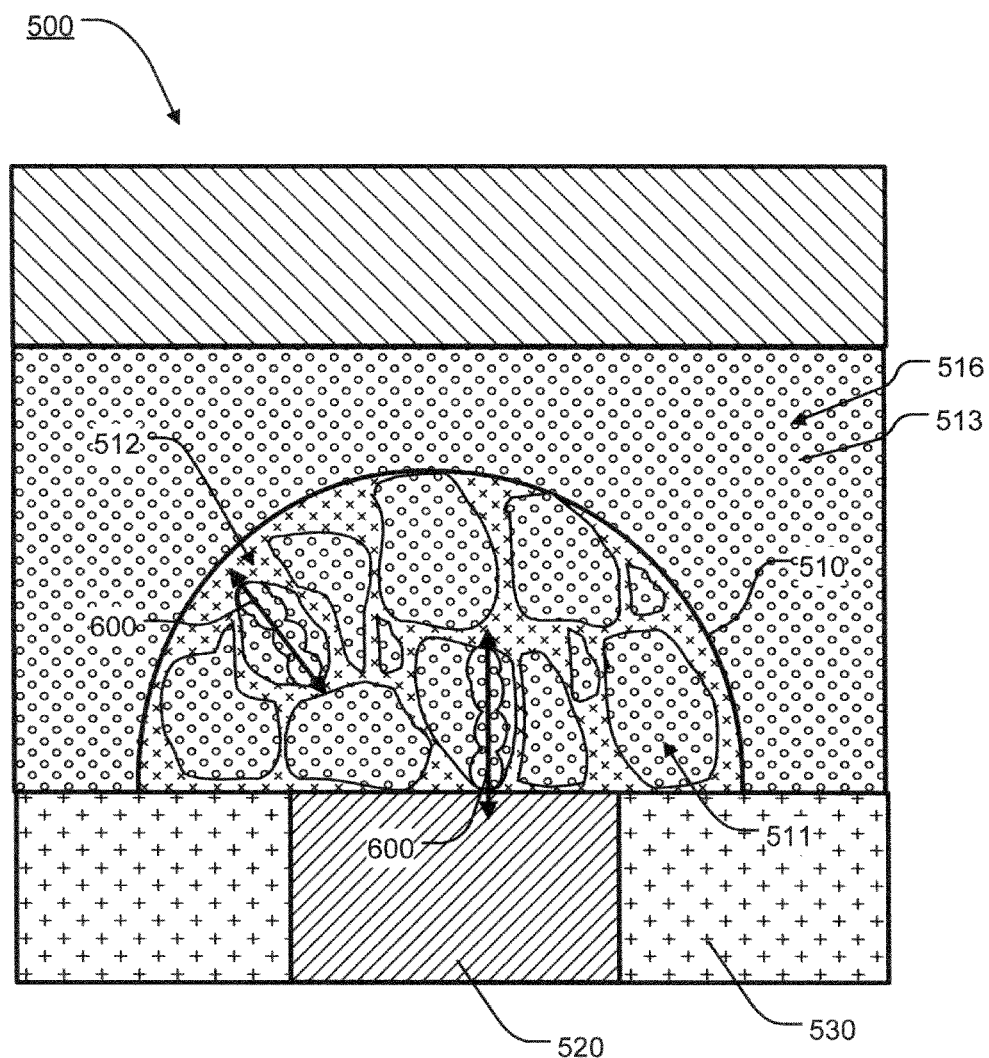
FIG. 6 is an expanded view of an active region of a memory cell as described herein in the reset state, with domains of phase change material separated by skins of dielectric material which may prevent the failure mode discussed above with reference to FIGS. 4A-4B.

FIG. 6 illustrates an expanded view of the memory cell 500 in the reset state of FIG. 5A, with reference to which one theory under which the improved endurance of cells made as described herein is offered. Since the dielectric mesh 512 surrounds and separates the phase change domains 511, the memory cell 500 can still maintain a high resistance state even if crystalline regions within the generally amorphous phase change domains 511 provide a low resistance path 600 through some of the domains 511. Thus, the dielectric mesh 512 limits the re-growth of the crystalline regions over time and thereby limits the formation of a low resistance path through the active region 510. Therefore the tailing bit failure rate is significantly reduced, resulting in improved data retention and reduced bit errors.

Figure 7:
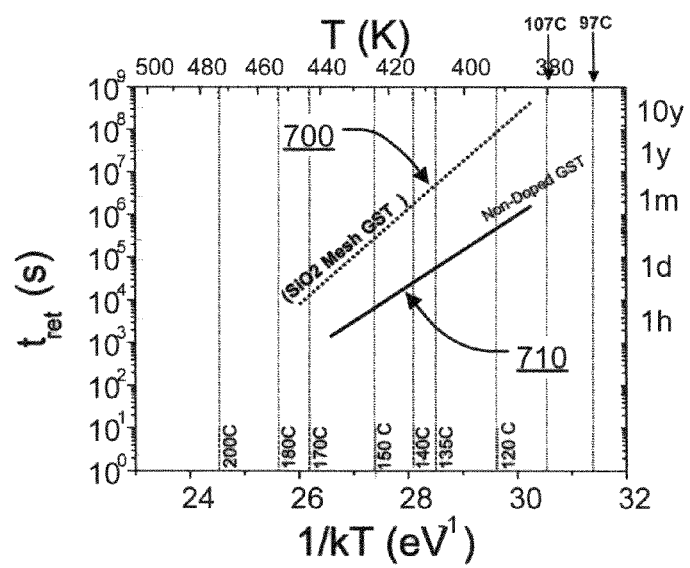
FIG. 7 is a graph illustrating improved data retention achieved by memory cells as described herein.

FIG. 7 illustrates a graph of the failure time versus temperature and illustrates the improved retention of memory cells as described herein. Line 700 represents an extrapolation of measured data of memory cells comprising $Ge_2Sb_2Te_5$ material doped with 10 to 20 at % silicon oxide and having an active region comprising phase change domains within a dielectric-rich mesh as described herein.

FIG. 7 also includes line 710 representing an extrapolation of measured data of memory cells comprising undoped GST material. As can be seen in FIG. 7, a significant improvement in the failure time is achieved for the memory cells having an active region comprising phase change domains within a dielectric-rich mesh.

Figure 8B:
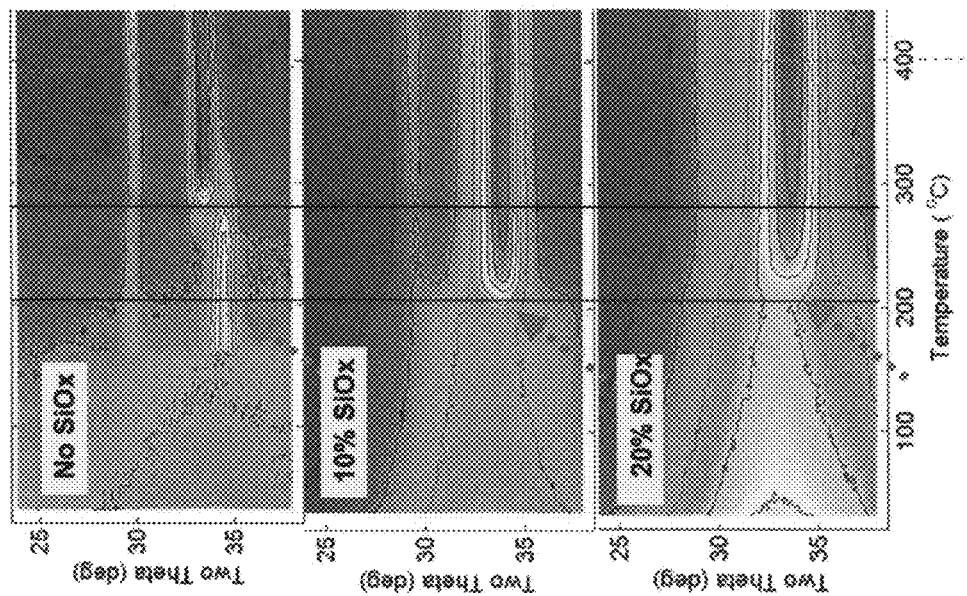
FIGS. 8A-8B show x-ray diffraction XRD spectra data illustrating suppression of the HCP crystalline phase of GST with silicon oxide doping as described herein.
Figure 8A:
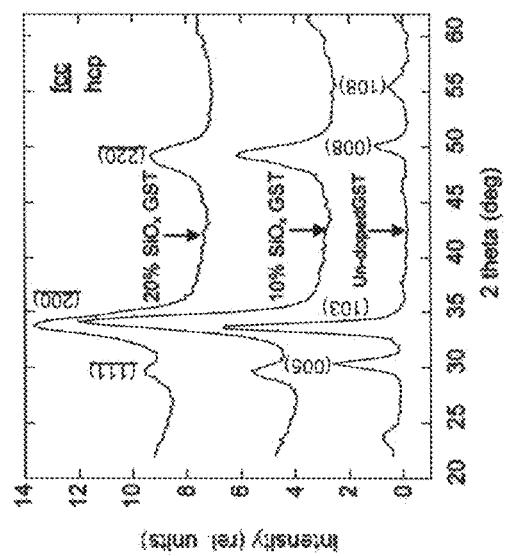

FIGS. 8A-8B illustrate x-ray diffraction XRD spectra data upon annealing of undoped $Ge_2Sb_2Te_5$ phase change material. GST based memory materials generally include two crystalline phases, a lower transition temperature FCC (face-centered cubic) phase and a higher transition temperature HCP (hexagonal close-packed) phase, the HCP phase having a higher density than the FCC phase. In general the transition from the FCC phase to the HCP phase is not desirable since the resulting decrease in memory material volume causes stresses within the memory material and at the interfaces between electrodes and the memory material. Also, the volume change from the amorphous phase to the crystalline phase is smaller for FCC phase material, and the transition will occur at higher speed.

FIGS. 8A and 8B illustrate that the transition of undoped $Ge_2Sb_2Te_5$ from the FCC phase to the HCP phase occurs below an anneal temperature of 400 degrees C. Since a memory cell comprising undoped $Ge_2Sb_2Te_5$ may experience a temperature of 400 degrees C. or more during set operations, issues can arise in the reliability of the memory cell due to this transition to the HCP state. Also, the speed of transition to the HCP phase will be slower.

FIGS. 8A-8B also illustrate XRD spectra data of doped $Ge_2Sb_2Te_5$ material having 10 at % and 20 at % silicon oxide as described herein, illustrating that the crystalline structure of the doped material remains in the FCC state at an anneal temperature of up to 400 degrees C.

Moreover, since in FIGS. 8A-8B the widths of the diffraction peaks of doped $Ge_2Sb_2Te_5$ material having 10 at % and 20 at % silicon oxide are wider than that of undoped $Ge_2Sb_2Te_5$, the doped $Ge_2Sb_2Te_5$ has a smaller grain size than undoped $Ge_2Sb_2Te_5$.

As a result, memory cells as described herein comprising doped $Ge_2Sb_2Te_5$ material having 10 to 20 at % silicon oxide annealed at temperatures as high as 400 degrees C. during set operations avoid the higher density HCP state, and thus experience less mechanical stress and have increased reliability and higher switching speed, compared to memory cells comprising undoped $Ge_2Sb_2Te_5$.

Figure 9:
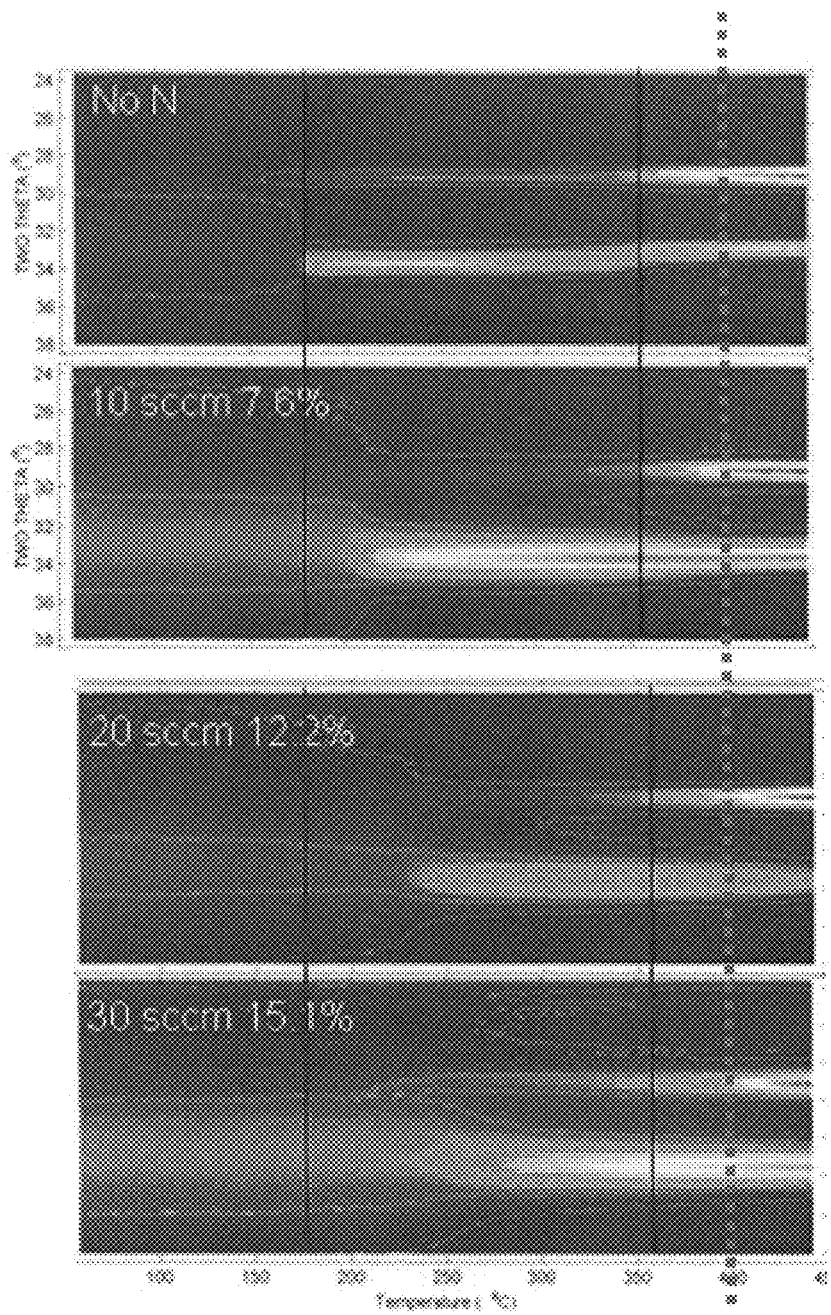
FIG. 9 is comparative x-ray diffraction XRD spectra data for nitrogen doping of GST phase change material, showing no suppression of either of the crystalline phases.

Prior art techniques include the doping of GST material with Nitrogen to modify properties of memory elements, and FIG. 9 illustrates XRD data of $Ge_2Sb_2Te_5$ material doped with various atomic percentages of Nitrogen. FIG. 9 shows that the transition of Nitrogen doped $Ge_2Sb_2Te_5$ from the FCC state to the HCP occurs below an anneal temperature of 400 degrees C. Therefore, memory cells as described herein comprising doped $Ge_2Sb_2Te_5$ material having 10 to 20 at % silicon oxide will experience less mechanical stress and have increased reliability and speed compared to memory cells comprising Nitrogen doped $Ge_2Sb_2Te_5$.

Figure 10:
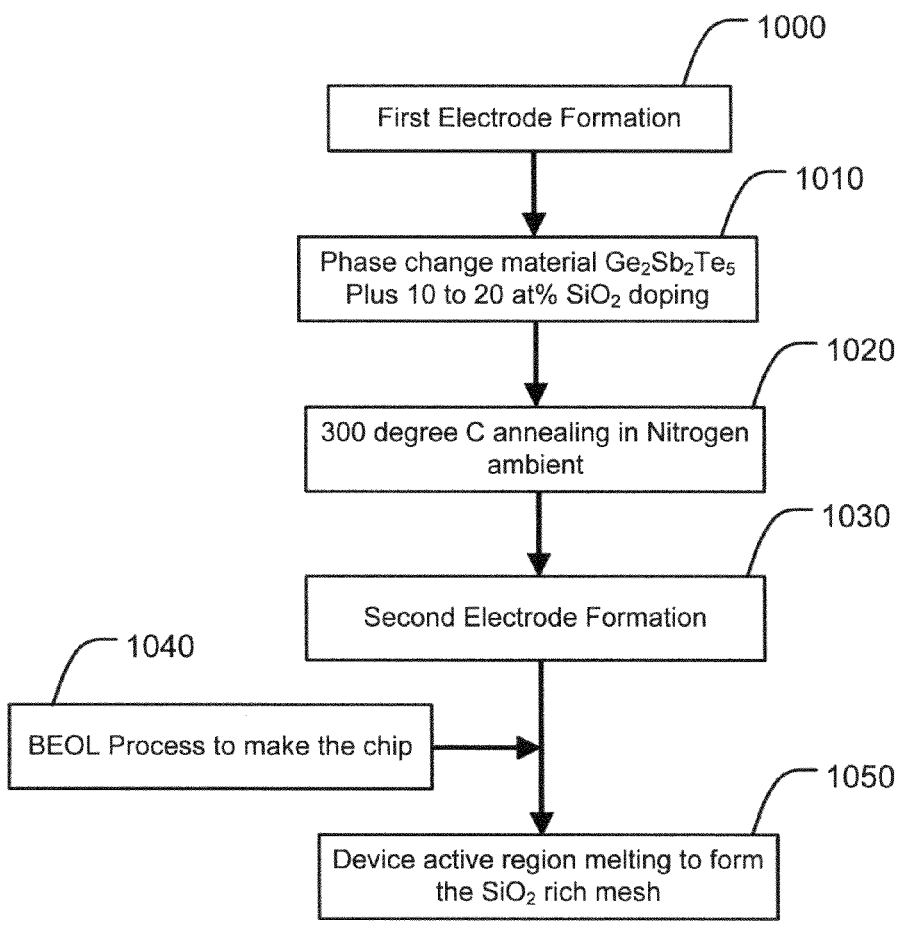
FIG. 10 is a simplified flowchart of a manufacturing process described herein.

FIG. 10 illustrates a process flow diagram and FIGS. 11A-11D illustrate steps in a manufacturing process for manufacturing a memory cell comprising $Ge_2Sb_2Te_5$ material doped with 10 to 20 at % silicon oxide and having an active region comprising phase change domains within a dielectric-rich mesh as described herein.

Figure 11A:
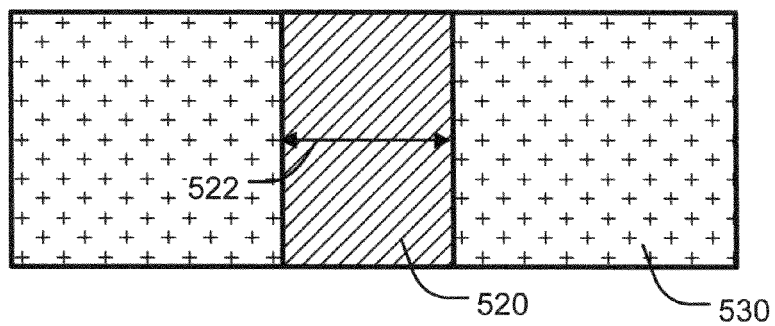
FIGS. 11A-11D illustrate stages of a manufacturing process for formation of the memory cell having a dielectric mesh in the active region as described herein.

At step 1000 the first electrode 520 having a width or diameter 522 is formed extending through dielectric 530, resulting in the structure illustrated in the cross-sectional view of FIG. 11A. In the illustrated embodiment the first electrode 520 comprises TiN and the dielectric 530 comprises SiN. In some embodiments the first electrode 520 has a sub-lithographic width or diameter 522.

The first electrode 520 extends through dielectric 530 to underlying access circuitry (not shown). The underlying access circuitry can be formed by standard processes as known in the art, and the configuration of elements of the access circuitry depends upon the array configuration in which the memory cells described herein are implemented. Generally, the access circuitry may include access devices such as transistors and diodes, word lines and sources lines, conductive plugs, and doped regions within a semiconductor substrate.

The first electrode 520 and the dielectric layer 530 can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode", which is incorporated by reference herein. For example, a layer of electrode material can be formed on the top surface of access circuitry (not shown), followed by patterning of a layer of photoresist on the electrode layer using standard photo lithographic techniques so as to form a mask of photoresist overlying the location of the first electrode 520. Next the mask of photoresist is trimmed, using for example oxygen plasma, to form a mask structure having sublithographic dimensions overlying the location of the first electrode 520. Then the layer of electrode material is etched using the trimmed mask of photoresist, thereby forming the first electrode 520 having a sublithographic diameter 522. Next dielectric material 530 is formed and planarized, resulting in the structure illustrated in FIG. 11A.

As another example, the first electrode 520 and dielectric 530 can be formed using methods, materials, and processes as disclosed in U.S. patent application Ser. No. 11/855,979 filed on 14 Sep. 2007 entitled "Phase Change Memory Cell in Via Array with Self-Aligned, Self-Converged Bottom Electrode and Method for Manufacturing", which is incorporated by reference herein. For example, the dielectric 530 can be formed on the top surface of access circuitry followed by sequentially forming an isolation layer and a sacrificial layer. Next, a mask having openings close to or equal to the minimum feature size of the process used to create the mask is formed on the sacrificial layer, the openings overlying the location of the first electrode 520. The isolation layer and the sacrificial layers are then selectively etched using the mask, thereby forming a via in the isolation and sacrificial layers and exposing a top surface of the dielectric layer 530. After removal of the mask, a selective undercutting etch is performed on the via such that the isolation layer is etched while leaving the sacrificial layer and the dielectric layer 530 intact. A fill material is then formed in the via, which due to the selective undercutting etch process results in a self-aligned void in the fill material being formed within the via. Next, an anisotropic etching process is performed on the fill material to open the void, and etching continues until the dielectric layer 530 is exposed in the region below the void, thereby forming a sidewall spacer comprising fill material within the via. The sidewall spacer has an opening dimension substantially determined by the dimensions of the void, and thus can be less than the minimum feature size of a lithographic process. Next, the dielectric layer 530 is etched using the sidewall spacers as an etch mask, thereby forming an opening in the dielectric layer 530 having a diameter less than the minimum feature size. Next, an electrode layer is formed within the openings in the dielectric layer 530. A planarizing process, such as chemical mechanical polishing CMP, is then performed to remove the isolation layer and the sacrificial layer and to form the first electrode 520, resulting in the structure illustrated in FIG. 11A.

Figure 11B:
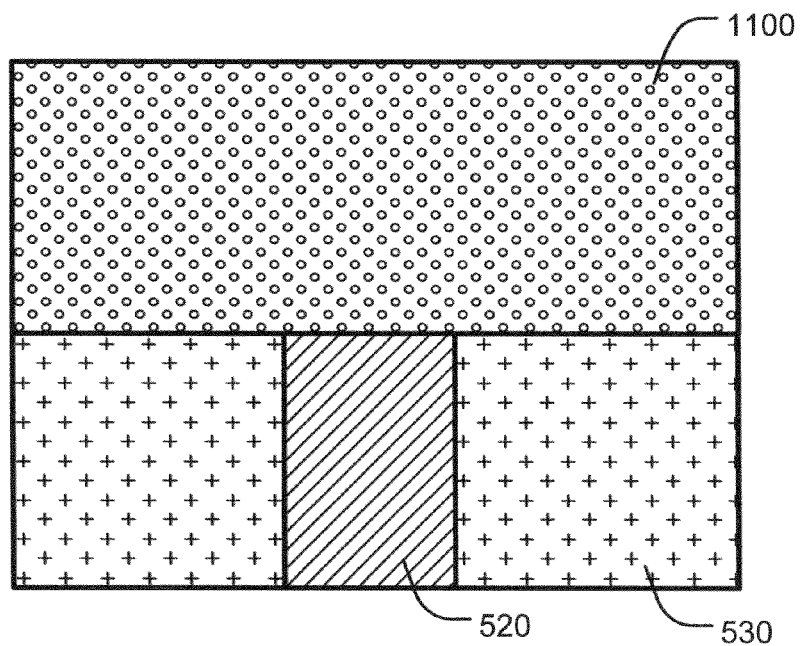

At step 1010 a layer of phase change material 1100 comprising doped $Ge_2Sb_2Te_5$ material having 10 to 20 at % silicon oxide is deposited on the first electrode 520 and dielectric 530 of FIG. 11A, resulting in the structure illustrated in FIG. 11B. The deposition of $Ge_2Sb_2Te_5$ and silicon oxide may be carried out by co-sputtering of a GST target with for one example, a DC power of 10 Watts and a $SiO_2$ target with an RF power of 10 to 115 Watts in an argon atmosphere.

Next, at step 1020 annealing is performed to crystallize the phase change material. In the illustrated embodiment the thermal annealing step is carried out at 300 degrees C. for 100 seconds in a nitrogen ambient. Alternatively, since subsequent back-end-of-line processes performed to complete the device may include high temperature cycles and or a thermal annealing step depending upon the manufacturing techniques used to complete the device, in some embodiments the annealing at step 1020 may accomplished by following processes, and no separate annealing step is added to the manufacturing line.

Figure 11C:
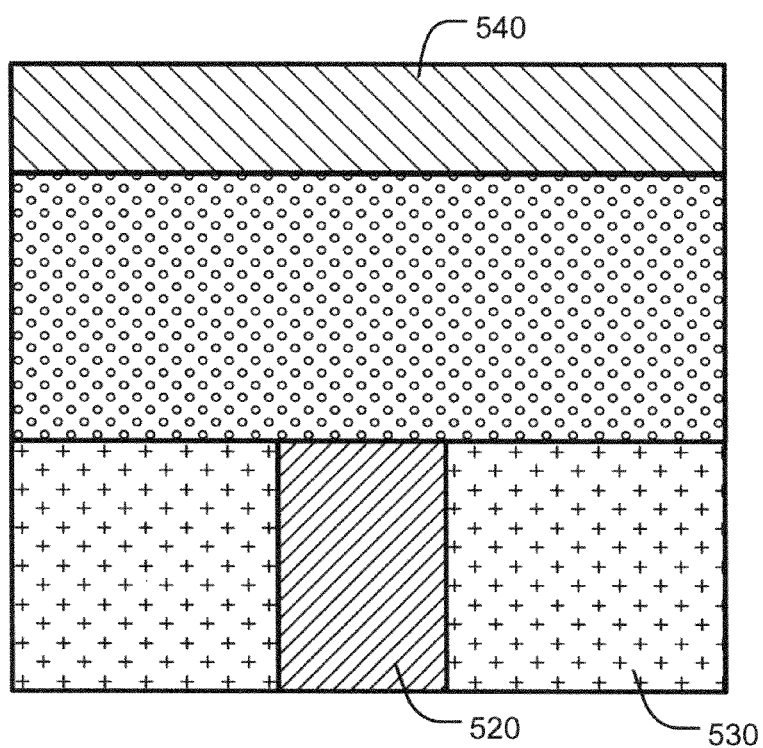

Next, at step 1030 second electrode 540 is formed, resulting in the structure illustrated in FIG. 11C. In the illustrated embodiment the second electrode 540 comprises TiN.

Figure 17:
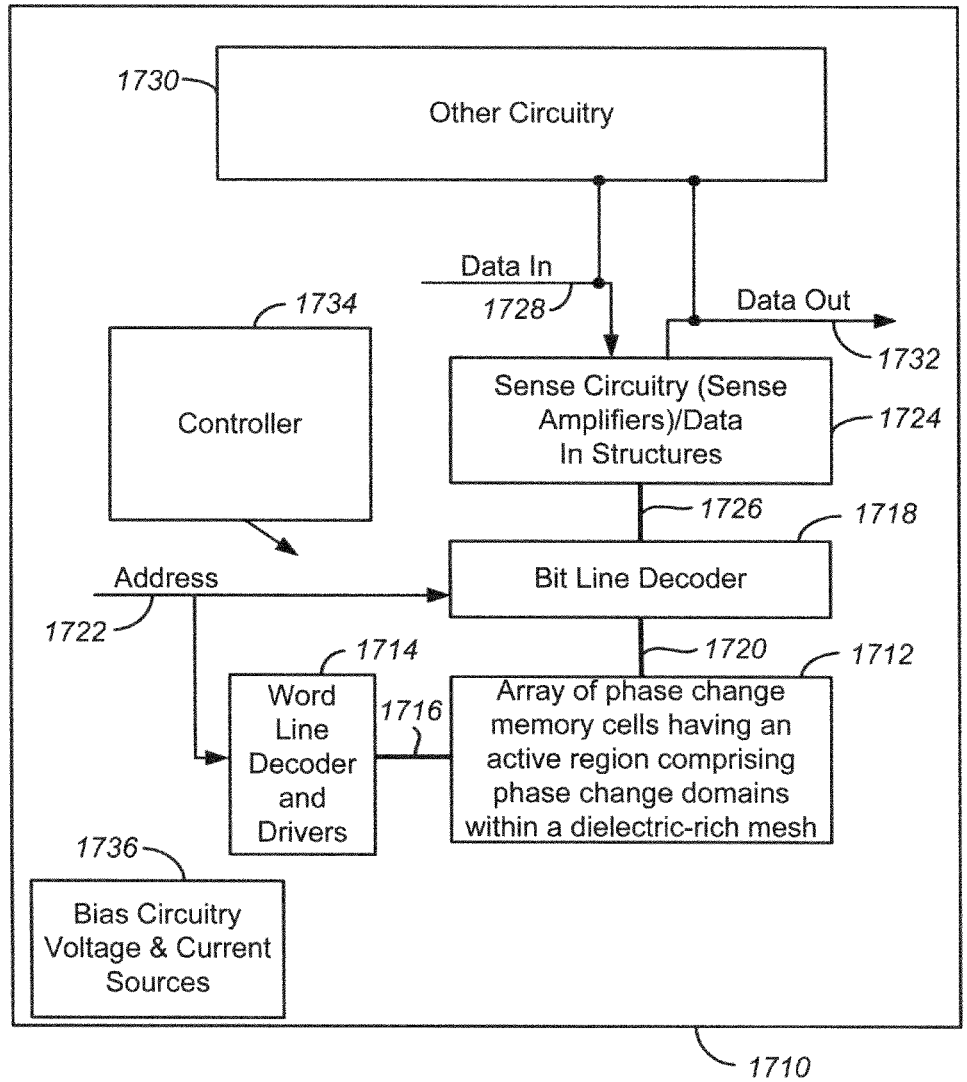
FIG. 17 is a simplified block diagram of an integrated circuit memory device including phase change memory cells as described herein.

Next, at step 1040 back-end-of-line (BEOL) processing is performed to complete the semiconductor process steps of the chip. The BEOL processes can be standard processes as known in the art, and the processes performed depend upon the configuration of the chip in which the memory cell is implemented. Generally, the structures formed by BEOL processes may include contacts, inter-layer dielectrics and various metal layers for interconnections on the chip including circuitry to couple the memory cell to periphery circuitry. These BEOL processes may include deposition of dielectric material at elevated temperatures, such as depositing SiN at 400 degrees C. or high density plasma HDP oxide deposition at temperatures of 500 degrees C. or greater. As a result of these processes, control circuits and biasing circuits as shown in FIG. 17 are formed on the device.

Figure 11D:
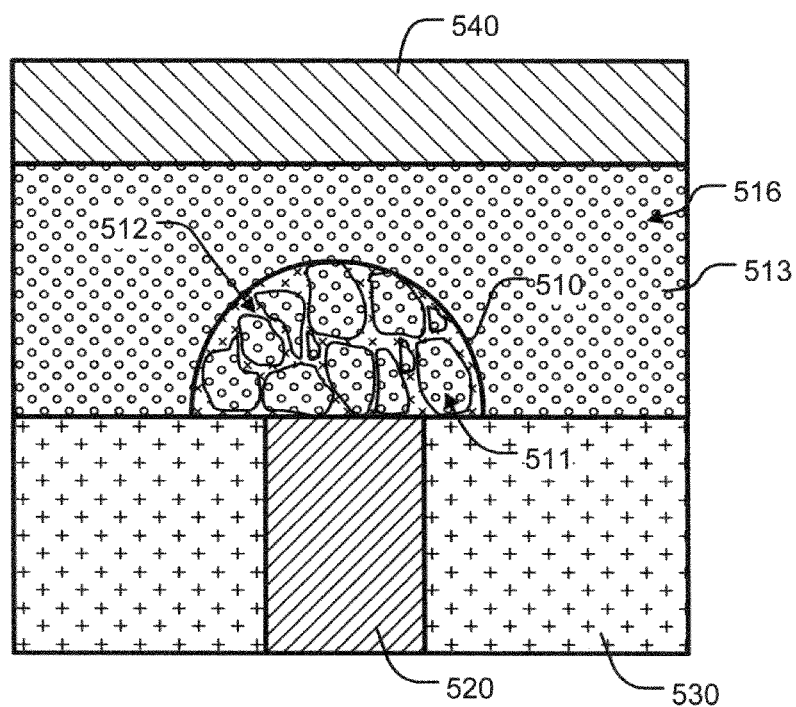

Next, at step 1050 current is applied to the memory cells in the array to melt the active region, and allow cooling to form the dielectric mesh, such as by reset cycling (or set/reset cycling) on the memory cell 500 using the control circuits and bias circuits to melt and cool the active regions at least once, or enough times, to cause formation of the dielectric mesh. The number of cycles needed to form the active region 510 comprising phase change domains 511 within a dielectric-rich mesh 512, may be for example 1 to 100 times. The resulting structure is illustrated in FIG. 11D. The cycling consists of applying appropriate voltage pulses to the first and second electrodes 520, 540 to induce a current in the memory element sufficient to melt the material in the active region, and followed by an interval with no or small current allowing the active region to cool. The melting/cooling cycling can be implemented using the set/reset circuitry on the device, by applying one or more reset pulses sufficient to melt the active region, or a sequence of set and reset pulses. In addition, the control circuits and bias circuits may be implemented to execute a mesh forming mode, using voltage levels and pulse lengths that differ from the normal set/reset cycling used during device operation. In yet another alternative, the melting/cooling cycling may be executed using equipment in the manufacturing line that connects to the chips during manufacture, such as test equipment, to set voltage magnitudes and pulse heights.

Figure 12:
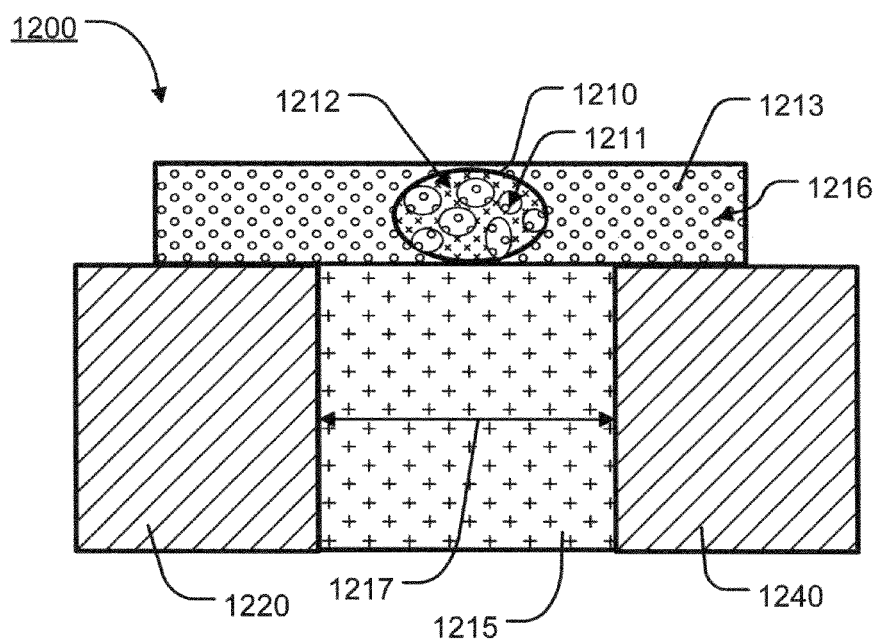
FIG. 12 illustrates a bridge type memory cell structure using a phase change material with a dielectric mesh in the active region as described herein.
Figure 13:
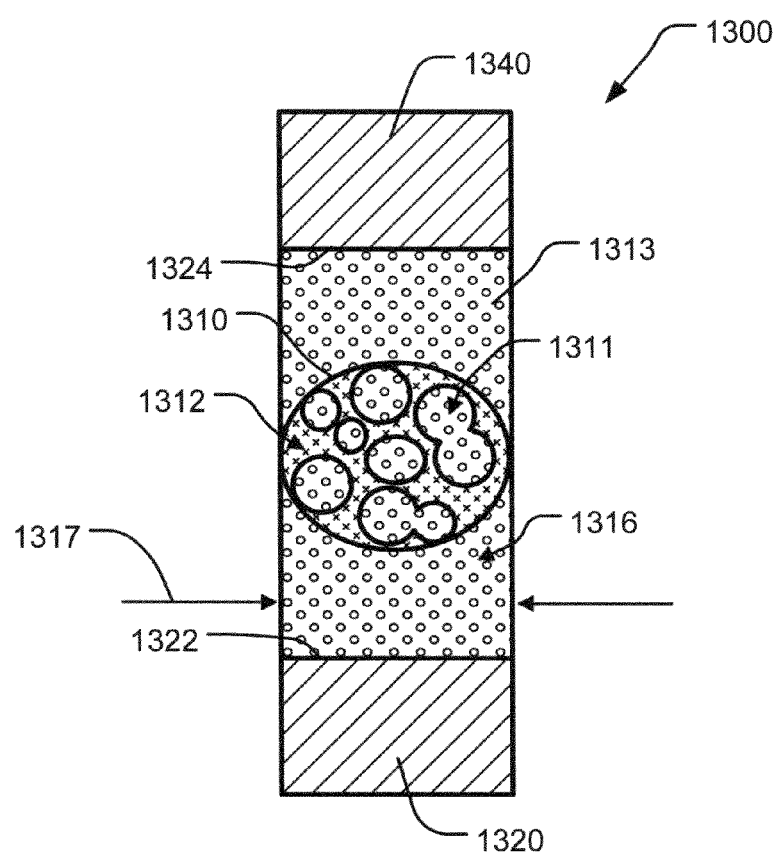
FIG. 13 illustrates an "active in via" type memory cell structure using a phase change material with a dielectric mesh in the active region as described herein.
Figure 14:
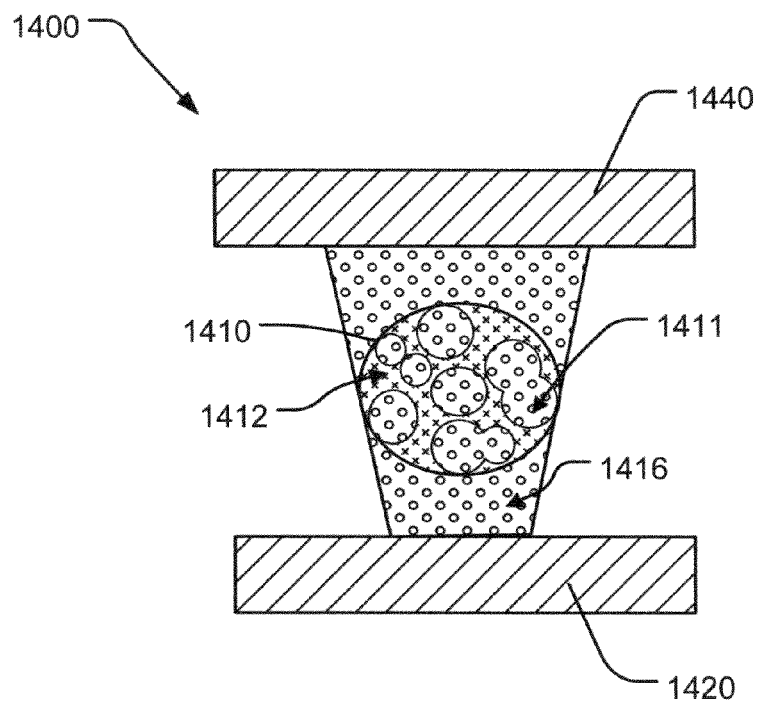
FIG. 14 illustrates a pore type memory cell structure using a phase change material with a dielectric mesh in the active region as described herein.

FIGS. 12-14 also illustrate memory cells comprising $Ge_2Sb_2Te_5$ material doped with 10 to 20 at % silicon oxide, having an active region comprising phase change domains within a dielectric-rich mesh. The materials described above with reference to the elements of FIGS. 5A-5B may be implemented in the memory cells of FIGS. 12-14, and thus a detailed description of these materials is not repeated.

FIG. 12 illustrates a cross-sectional view of a second memory cell 1200 having an active region 1210 comprising phase change domains 1211 within a dielectric-rich mesh 1212.

The memory cell 1200 includes a dielectric spacer 1215 separating first and second electrodes 1220, 1240. Memory element 1216 extends across the dielectric spacer 1215 to contact the first and second electrodes 1220, 1240, thereby defining an inter-electrode current path between the first and second electrodes 1220, 1240 having a path length defined by the width 1217 of the dielectric spacer 1215. In operation, as current passes between the first and second electrodes 1220, 1240 and through the memory element 1216, the active region 1210 heats up more quickly than the remainder 1213 of the memory element 1216.

FIG. 13 illustrates a cross-sectional view of a third memory cell 1300 having an active region 1310 comprising phase change domains 1311 within a dielectric-rich mesh 1312.

The memory cell 1300 includes a pillar shaped memory element 1316 contacting first and second electrodes 1320, 1340 at top and bottom surfaces 1322, 1324 respectively. The memory element 1316 has a width 1317 substantially the same as that of the first and second electrodes 1320, 1340 to define a multi-layer pillar surrounded by dielectric (not shown). As used herein, the term "substantially" is intended to accommodate manufacturing tolerances. In operation, as current passes between the first and second electrodes 1320, 1340 and through the memory element 1316, the active region 1310 heats up more quickly than the remainder 1313 of the memory element.

FIG. 14 illustrates a cross-sectional view of a fourth memory cell 1400 having an active region 1410 comprising phase change domains 1411 within a dielectric-rich mesh 1412.

The memory cell 1400 includes a pore-type memory element 1416 surrounded by dielectric (not shown) contacting first and second electrodes 1420, 1440 at top and bottom surfaces respectively. The memory element has a width less than that of the first and second electrodes, and in operation as current passes between the first and second electrodes and through the memory element the active region heats up more quickly than the remainder of the memory element.

As will be understood, the present invention is not limited to the memory cell structures described herein and generally includes memory cells having an active region comprising phase change domains within a dielectric-rich mesh.

Figures 15A, 15B:
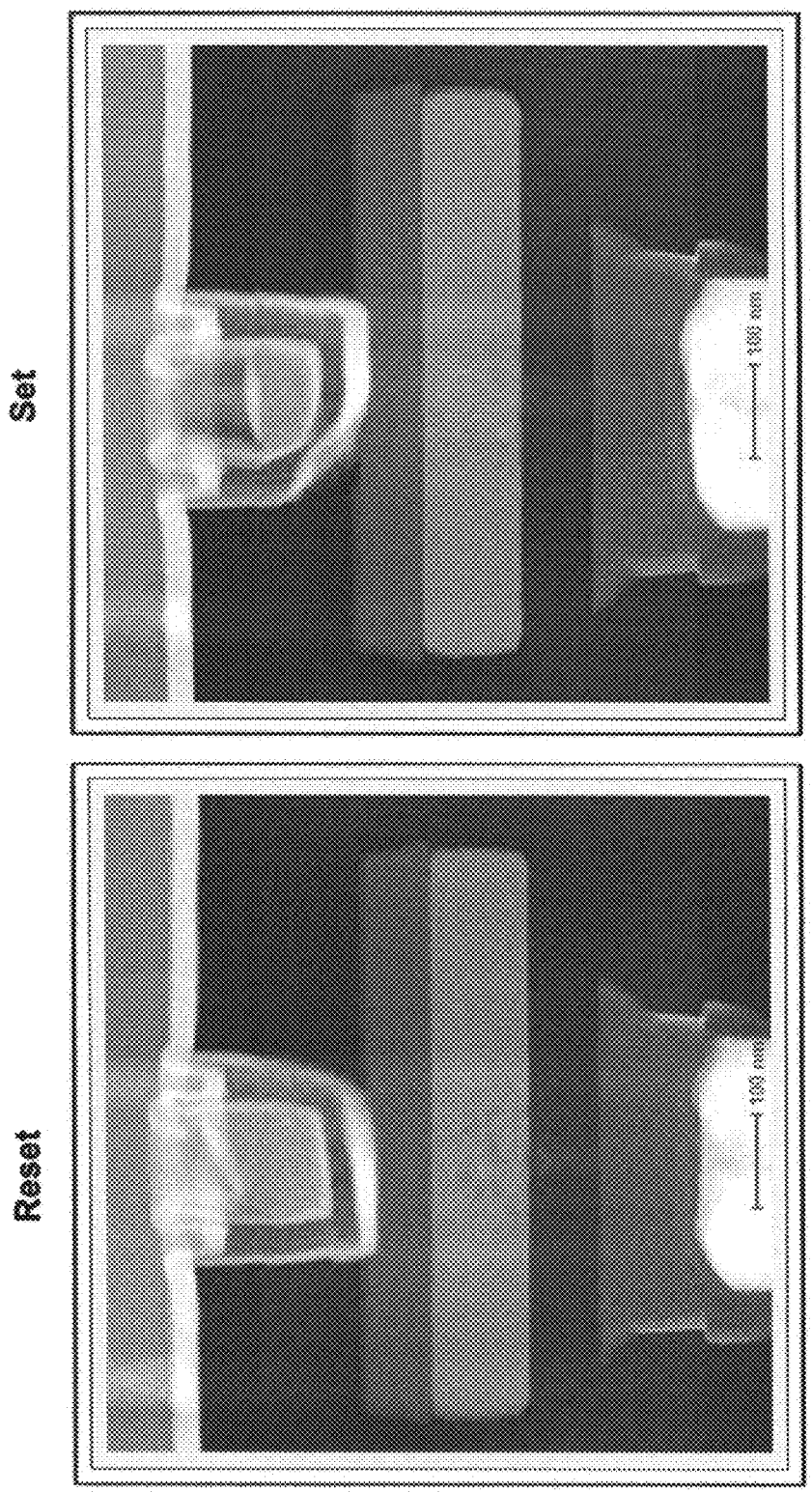
FIGS. 15A-15B are transmission electron microscope (TEM) images of a cross-section of a mushroom type memory cell comprising silicon oxide doped GST as described herein in the reset and set states, respectively.

FIGS. 15A and 15B are transmission electron microscope (TEM) images of a cross-section of a mushroom type memory cell comprising silicon oxide doped phase change material as described herein in the reset and set states respectively after cycling of 10 times. The memory cell of FIGS. 15A-15B was formed as described above with reference to FIGS. 10-11, and thus comprises $Ge_2Sb_2Te_5$ material doped with 10 to 20 at % silicon oxide and has an active region comprising phase change domains within a dielectric-rich mesh. As can be seen in FIGS. 15A-15B, in both the reset and set state the phase change domains of the active region can be seen. In the photographs, the doped phase change material appears as a medium gray horizontal bar in the center having a top electrode of darker gray overlying the phase change material, and with bottom electrode pillars vaguely visible, extending through a black bar beneath the phase change material. Dome shaped active regions having radii just smaller than the thickness of the layer, are visible on close inspection with a different physical order than the body of material outside the active regions. The bodies of phase change material show very uniform boundaries, characteristic of small grain size polycrystalline structure.

Figure 16A:
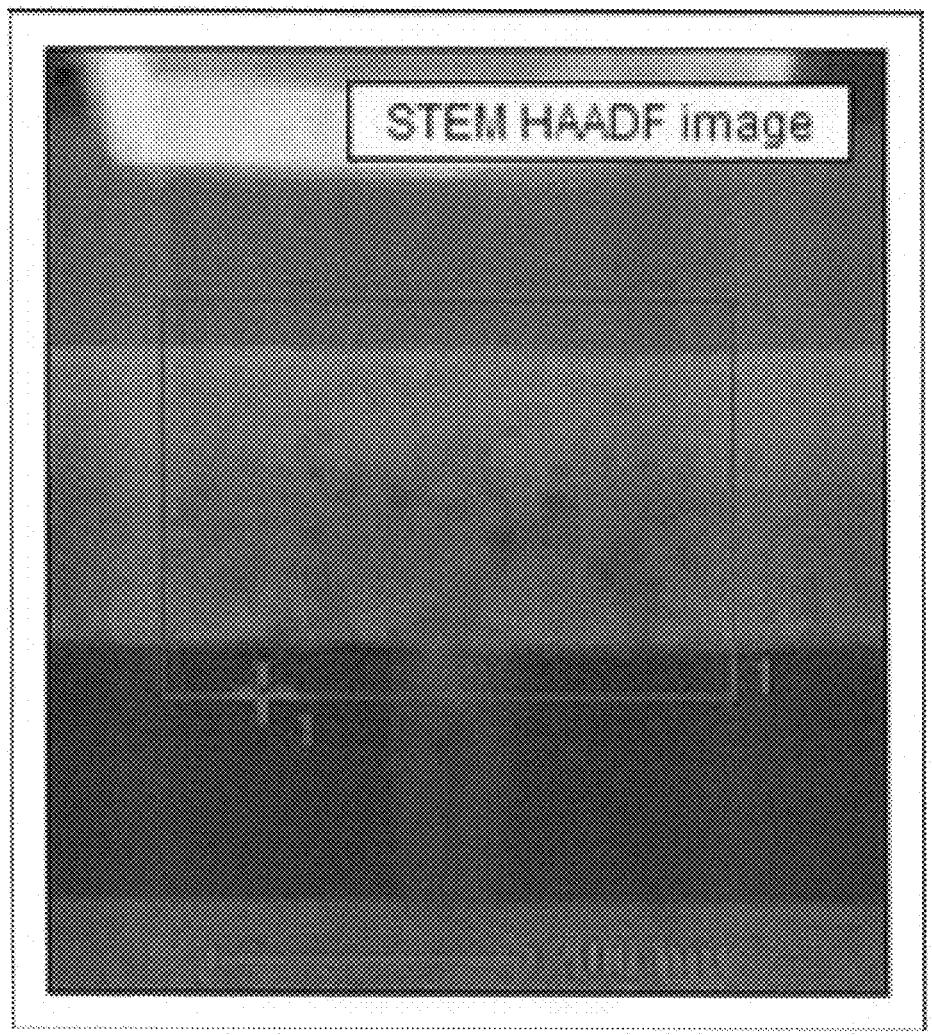
FIGS. 16A-16C include a TEM image of the memory cell of FIGS. 15A-15B in the reset state, including FIG. 16A which is an expanded image of the active region (within rectangle) of the memory element.
Figure 16B:
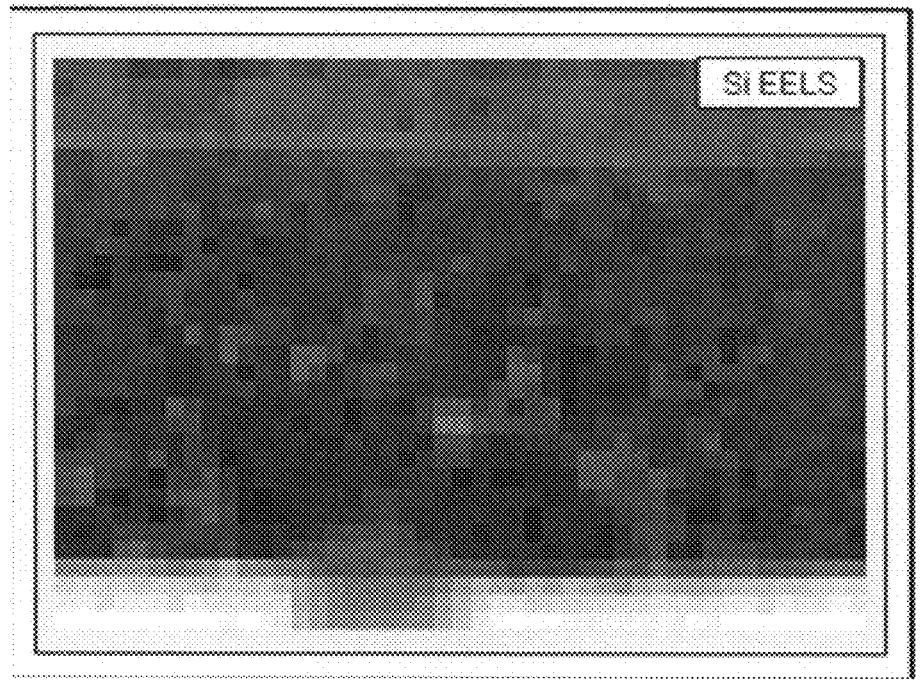
Figure 16C:
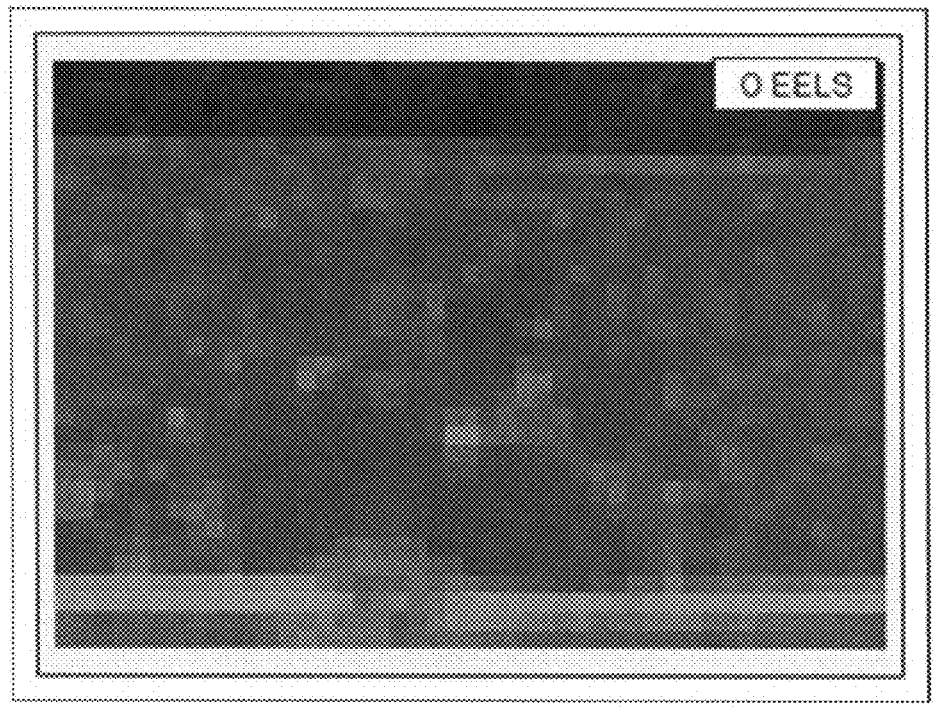

FIGS. 16A-16C are additional TEM images of the memory cell of FIGS. 15A-15B in the reset state. FIG. 16A is an expanded image of the active region (within rectangle) of the memory element showing the boundaries between the phase change domains. In FIG. 16A, domains within the dielectric mesh are seen. FIGS. 16B-16C are images of the electron energy loss spectroscopy (EELS) of Si and O respectively. FIGS. 16B and 16C show a clear correlation of the locations of Si and O and show the Si and O between the boundaries of the phase change domains that are visible in FIG. 16A. Also, the phase change domains appear to be empty of Si and O.

FIG. 17 is a simplified block diagram of an integrated circuit 1710 including a memory array 1712 implemented using memory cells having an active region comprising phase change domains within a dielectric-rich mesh as described herein. A word line decoder 1714 having read, set and reset modes is coupled to and in electrical communication with a plurality of word lines 1716 arranged along rows in the memory array 1712. A bit line (column) decoder 1718 is in electrical communication with a plurality of bit lines 1720 arranged along columns in the array 1712 for reading, setting, and resetting the phase change memory cells (not shown) in array 1712. Addresses are supplied on bus 1722 to word line decoder and drivers 1714 and bit line decoder 1718. Sense circuitry (Sense amplifiers) and data-in structures in block 1724, including voltage and/or current sources for the read, set, and reset modes are coupled to bit line decoder 1718 via data bus 1726. Data is supplied via a data-in line 1728 from input/output ports on integrated circuit 1710, or from other data sources internal or external to integrated circuit 1710, to data-in structures in block 1724. Other circuitry 1730 may be included on integrated circuit 1710, such as a general purpose processor or special purpose application circuitry, or a combination of modules providing system-on-a-chip functionality supported by array 1712. Data is supplied via a data-out line 1732 from the sense amplifiers in block 1724 to input/output ports on integrated circuit 1710, or to other data destinations internal or external to integrated circuit 1710.

A controller 1734 implemented in this example, using a bias arrangement state machine, controls the application of bias circuitry voltage and current sources 1736 for the application of bias arrangements including read, program, erase, erase verify and program verify voltages and/or currents for the word lines and bit lines. In addition, bias arrangements for melting/cooling cycling may be implemented as mentioned above. Controller 1734 may be implemented using special-purpose logic circuitry as known in the art. In alternative embodiments, controller 1734 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1734.

Figure 18:
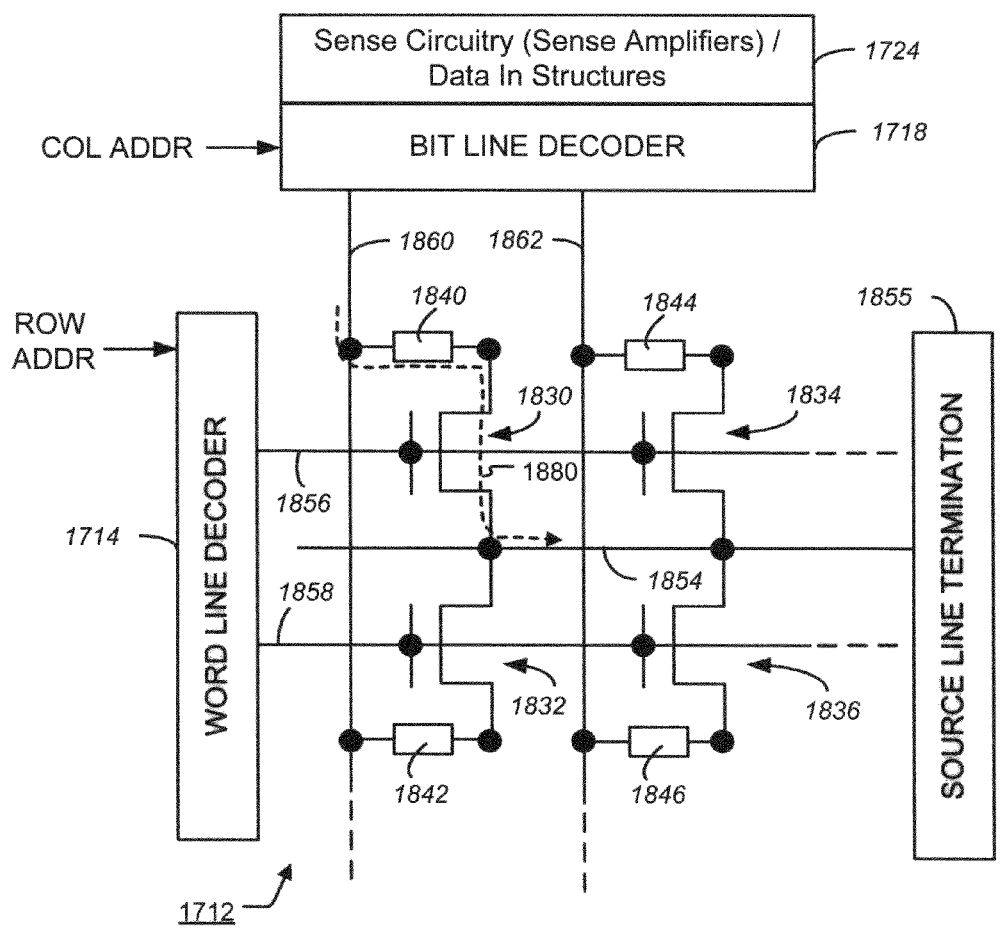
FIG. 18 is a simplified circuit diagram of a memory array including phase change memory cells as described herein.

As shown in FIG. 18, each of the memory cells of array 1712 includes an access transistor (or other access device such as a diode) and memory element having an active region comprising phase change domains within a dielectric-rich mesh. In FIG. 18 four memory cells 1830, 1832, 1834, 1836 having respective memory elements 1840, 1842, 1844, 1846 are illustrated, representing a small section of an array that can include millions of memory cells.

Sources of each of the access transistors of memory cells 1830, 1832, 1834, 1836 are connected in common to source line 1854 that terminates in a source line termination circuit 1855, such as a ground terminal. In another embodiment the source lines of the access devices are not electrically connected, but independently controllable. The source line termination circuit 1855 may include bias circuitry such as voltage sources and current sources, and decoding circuits for applying bias arrangements, other than ground, to the source line 1854 in some embodiments.

A plurality of word lines including word lines 1856, 1858 extend in parallel along a first direction. Word lines 1856, 1858 are in electrical communication with word line decoder 1714. The gates of access transistors of memory cells 1830 and 1834 are connected to word line 1856, and the gates of access transistors of memory cells 1832 and 1836 are connected in common to word line 1858.

A plurality of bit lines including bit lines 1860, 1862 extend in parallel in a second direction and are in electrical communication with bit line decoder 1718. In the illustrated embodiment each of the memory elements are arranged between the drain of the corresponding access device and the corresponding bit line. Alternatively, the memory elements may be on the source side of the corresponding access device.

It will be understood that the memory array 1712 is not limited to the array configuration illustrated in FIG. 18, and additional array configurations can also be used. Additionally, instead of MOS transistors bipolar transistors or diodes may be used as access devices in some embodiments.

In operation each of the memory cells in the array 1712 store data depending upon the resistance of the corresponding memory element. The data value may be determined, for example, by comparison of current on a bit line for a selected memory cell to that of a suitable reference current by sense amplifiers of sense circuitry 1724. The reference current can be established to that a predetermined range of currents correspond to a logical "0", and a differing range of current correspond to a logical "1".

Reading or writing to a memory cell of array 1712, therefore, can be achieved by applying a suitable voltage to one of word lines 1858, 1856 and coupling one of bit lines 1860, 1862 to a voltage source so that current flows through the selected memory cell. For example, a current path 1880 through a selected memory cell (in this example memory cell 1830 and corresponding memory element 1840) is established by applying voltages to the bit line 1860, word line 1856, and source line 1854 sufficient to turn on the access transistor of memory cell 1830 and induce current in path 1880 to flow from the bit line 1860 to the source line 1854, or vice-versa. The level and duration of the voltages applied is dependent upon the operation performed, e.g. a reading operation or a writing operation.

In a reset (or erase) operation of the memory cell 1830, word line decoder 1714 facilitates providing word line 1856 with a suitable voltage pulse to turn on the access transistor of the memory cell 1830. Bit line decoder 1718 facilitates supplying a voltage pulse to bit line 1860 of suitable amplitude and duration to induce a current to flow though the memory element 1840, the current raising the temperature of the active region of the memory element 1840 above the transition temperature of the phase change material and also above the melting temperature to place the phase change material of the active region in a liquid state. The current is then terminated, for example by terminating the voltage pulses on the bit line 1860 and on the word line 1856, resulting in a relatively quick quenching time as the active region cools to a high resistance generally amorphous phase in the phase change domains of the active region to establish a high resistance reset state in the memory cell 1830. The reset operation can also comprise more than one pulse, for example using a pair of pulses.

In a set (or program) operation of the selected memory cell 1830, word line decoder 1714 facilitates providing word line 1856 with a suitable voltage pulse to turn on the access transistor of the memory cell 1830. Bit line decoder 1718 facilitates supplying a voltage pulse to bit line 1860 of suitable amplitude and duration to induce a current to flow through the memory element 1840, the current pulse sufficient to raise the temperature of the active region above the transition temperature and cause a transition in the phase change domains of the active region from the high resistance generally amorphous condition into a low resistance generally crystalline condition, this transition lowering the resistance of all of the memory element 1840 and setting the memory cell 1530 to the low resistance state.

In a read (or sense) operation of the data value stored in the memory cell 1830, word line decoder 1714 facilitates providing word line 1856 with a suitable voltage pulse to turn on the access transistor of the memory cell 1830. Bit line decoder 1718 facilitates supplying a voltage to bit line 1860 of suitable amplitude and duration to induce current to flow through the memory element 1840 that does not result in the memory element undergoing a change in resistive state. The current on the bit line 1860 and through the memory cell 1830 is dependent upon the resistance of, and therefore the data state associated with, the memory cell. Thus, the data state of the memory cell may be determined by detecting whether the resistance of the memory cell 1830 corresponds to the high resistance state or the low resistance state, for example by comparison of the current on bit line 1860 with a suitable reference current by sense amplifiers of sense circuitry 1724.

The materials used in the embodiment described herein consist of silicon oxide and $G_2S_2T_5$. Other chalcogenides may be used as well. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a memory device, the method comprising:
   forming a first electrode and a second electrode;
   forming a body of phase change memory material between the first and second electrodes, the phase change memory material comprising a chalcogenide material doped with a dielectric material; and
   creating a first, active region and a second region within the body of phase change memory material, the creating step comprising;
      forming within the first region a first concentration of the phase change material and a second concentration of the dielectric material; and
      forming within the first, active region:
         a plurality phase change material domains having a first concentration of the phase change material; and
         a mesh of the dielectric material at least partially separating the plurality of phase change material domains; and
      forming the phase change memory material within the second region in a polycrystalline state with grains without a mesh of the dielectric material surrounding the grains.

2. The method of claim 1, including
   forming the body of phase change memory material in a polycrystalline state; and
   the first, active region forming step comprising melting and solidifying the phase change memory material at least once within the first, active region in the body of phase change material without disturbing the polycrystalline state in the second region, thereby forming the plurality of phase change material domains and the mesh of the dielectric material.

3. The method of claim 2, including forming circuitry on the memory device to apply set and reset pulses across the first and second electrodes for writing data, and performing said melting and solidifying by applying a reset pulse across the first and second electrodes.

4. The method of claim 2, including forming circuitry on the memory device to apply set and reset pulses across the first and second electrodes for writing data, and performing said melting and solidifying by applying a set pulse and a reset pulse across the first and second electrodes.

5. The method of claim 1, wherein the chalcogenide material used in the phase change memory material, when not doped with the dielectric material is characterized by a first solid crystalline phase having first volume and by a second solid crystalline phase having second volume, the phase change memory material having a volume in the amorphous phase which is closer to the second volume than the first volume, and wherein the chalcogenide material doped with a dielectric material has a concentration of the dielectric material sufficient to promote formation of the second solid crystalline phase.

6. The method of claim 5, wherein the first solid crystalline phase is a HCP phase, and the second solid crystalline phase is a FCC phase.

7. The method of claim 1, wherein the chalcogenide material used in the phase change memory material, when not doped with the dielectric, is characterized by a plurality of solid crystalline states, and wherein the chalcogenide material doped with a dielectric material has a concentration of the dielectric material sufficient to prevent formation of at least one of the solid crystalline states in the active region.

8. The method of claim 1, wherein the chalcogenide material used in the phase change memory material, when not doped with the dielectric, is characterized by a plurality of solid crystalline states, and wherein the chalcogenide material doped with a dielectric material has a concentration of the dielectric material sufficient to prevent formation of at least one of the solid crystalline states in the first region.

9. The method of claim 1, wherein the dielectric material in the chalcogenide doped with dielectric material is silicon oxide, having a concentration in a range of 10 to 20 at %.

10. The method of claim 1, wherein the chalcogenide material used in the phase change memory material comprises $Ge_xSb_yTe_z$.

11. The method of claim 1, wherein the chalcogenide material used in the phase change memory material comprises $Ge_xSb_yTe_z$, where x=2, y=2 and z=5; and wherein the dielectric material in the chalcogenide doped with dielectric material is silicon oxide, having a concentration in a range of 10 to 20 at %.

12. A phase change memory device, comprising:
a first electrode and a second electrode;
a body of phase change memory material between the first and second electrodes, the phase change memory material comprising a chalcogenide material doped with a dielectric material; and
the body of phase change material having a first, active region and a second region;
the first, active region comprising:
a plurality of phase change material domains having a first concentration of phase change material; and
a mesh of the dielectric material at least partially separating the plurality of phase change material domains; and
the second region being in a polycrystalline state with grains without a mesh of the dielectric material surrounding the grains, the second regain having a second concentration of phase change material, the second concentration being less than the first concentration.

13. The device of claim 12, wherein the chalcogenide material used in the phase change memory material, when not doped with the dielectric is characterized by a first solid crystalline phase having first volume and by a second solid crystalline phase having second volume, the phase change memory material having a volume in the amorphous phase which is closer to the second volume than the first volume, and wherein the chalcogenide material doped with a dielectric material has a concentration of the dielectric material sufficient to promote formation of the second solid crystalline phase.

14. The device of claim 12, wherein the first solid crystalline phase is a HCP phase, and the second solid crystalline phase is a FCC phase.

15. The device of claim 12, wherein the chalcogenide material used in the phase change memory material, when not doped with the dielectric material, is characterized by a plurality of solid crystalline states, and wherein the chalcogenide material doped with a dielectric material has a concentration of the dielectric material sufficient to prevent formation of at least one of the solid crystalline states in the active region.

16. The device of claim 12, wherein the chalcogenide material used in the phase change memory material, when not doped with the dielectric material, is characterized by a plurality of solid crystalline states, and wherein the chalcogenide material doped with a dielectric material has a concentration of the dielectric material sufficient to prevent formation of at least one of the solid crystalline states outside the active region.

17. The device of claim 12, the dielectric material in the chalcogenide doped with a dielectric material is silicon oxide, having a concentration in a range of 10 to 20 at %.

18. The device of claim 12, including circuitry on the memory device to apply set and reset pulses across the first and second electrodes for writing data, and for melting and solidifying the active region by applying at least one reset pulse across the first and second electrodes.

19. The device of claim 12, including circuitry on the memory device to apply set and reset pulses across the first and second electrodes for writing data, and for melting and solidifying the active region by applying at least one set pulse and at least one reset pulse across the first and second electrodes.

20. The device of claim 12, wherein the chalcogenide material used in the phase change memory material comprises $Ge_xSb_yTe_z$.

21. The device of claim 12, wherein the chalcogenide material used in the phase change memory material comprises $Ge_xSb_yTe_z$, where x=2, y=2 and z=5; and wherein the dielectric material is silicon oxide having a concentration in a range of 10 to 20 at %.

* * * * *